United States Patent
Abbott et al.

(10) Patent No.: US 12,500,573 B2
(45) Date of Patent: Dec. 16, 2025

(54) ACOUSTIC WAVE FILTERS WITH IMPROVED SECOND HARMONIC RESPONSE

(71) Applicant: Skyworks Solutions, Inc., Irvine, CA (US)

(72) Inventors: Benjamin Paul Abbott, Irvine, CA (US); Mats Erik Fredriksson, Newbury Park, CA (US); Renfeng Jin, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 343 days.

(21) Appl. No.: 18/192,975

(22) Filed: Mar. 30, 2023

(65) Prior Publication Data

US 2023/0318561 A1    Oct. 5, 2023

Related U.S. Application Data

(60) Provisional application No. 63/325,539, filed on Mar. 30, 2022, provisional application No. 63/325,547, filed on Mar. 30, 2022.

(51) Int. Cl.
| | |
|---|---|
| *H03H 9/56* | (2006.01) |
| *H03H 9/02* | (2006.01) |
| *H03H 9/13* | (2006.01) |
| *H03H 9/205* | (2006.01) |

(52) U.S. Cl.
CPC ........ *H03H 9/568* (2013.01); *H03H 9/02086* (2013.01); *H03H 9/133* (2013.01); *H03H 9/205* (2013.01); *H03H 9/564* (2013.01)

(58) Field of Classification Search
CPC .... H03H 9/568; H03H 9/02086; H03H 9/133; H03H 9/205; H03H 9/564; H03H 9/02118; H03H 9/02157; H03H 9/132
USPC .................................................. 333/186–188
See application file for complete search history.

(56) References Cited

U.S. PATENT DOCUMENTS

| | | | |
|---|---|---|---|
| 7,786,649 B2 * | 8/2010 | Nishihara | H03H 9/564 310/320 |
| 9,172,350 B2 | 10/2015 | Nishimura et al. | |
| 2020/0274520 A1 | 8/2020 | Shin et al. | |
| 2020/0373901 A1 | 11/2020 | Liu et al. | |
| 2021/0083643 A1 | 3/2021 | Liu et al. | |
| 2022/0094335 A1 | 3/2022 | Zhang et al. | |
| 2022/0337219 A1 | 10/2022 | Kovacic et al. | |
| 2023/0006651 A1 | 1/2023 | Chen et al. | |
| 2023/0027129 A1 | 1/2023 | Caron et al. | |
| 2023/0109580 A1 | 4/2023 | Abbott et al. | |
| 2023/0124493 A1 | 4/2023 | Shin et al. | |

(Continued)

*Primary Examiner* — Jorge L Salazar, Jr.
(74) *Attorney, Agent, or Firm* — Knobbe, Martens, Olson & Bear, LLP

(57) ABSTRACT

A first acoustic wave device can have a piezoelectric layer between a first electrode and a second electrode. The first acoustic wave device can have a first shape and a first area. A second acoustic wave device can be coupled to the first acoustic wave device to at least partially cancel a second harmonic response of the first acoustic wave device. The second acoustic wave device can have a piezoelectric layer between a first electrode and a second electrode. The second acoustic wave device can have a second shape that is different from the first shape and a second area that is within a threshold amount of the first area.

21 Claims, 11 Drawing Sheets

(56) References Cited

U.S. PATENT DOCUMENTS

2023/0318570 A1 10/2023 Abbott et al.
2023/0327635 A1 10/2023 Hill et al.

\* cited by examiner

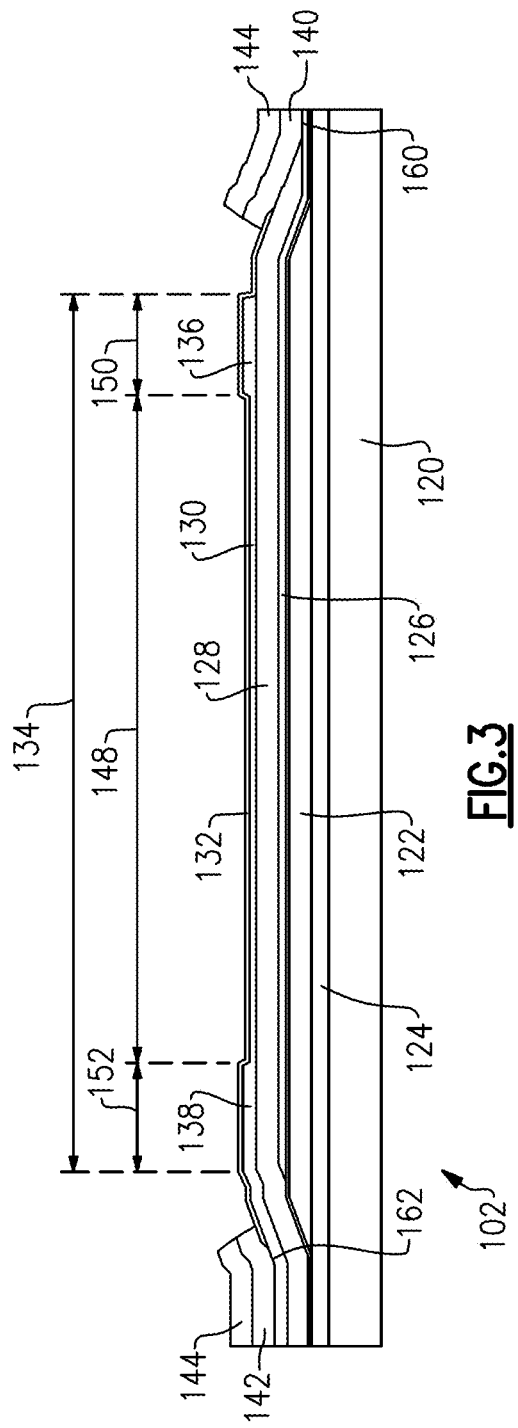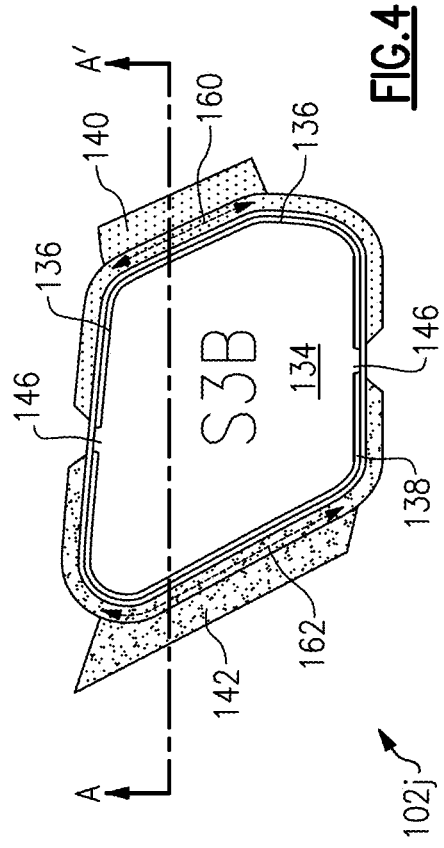

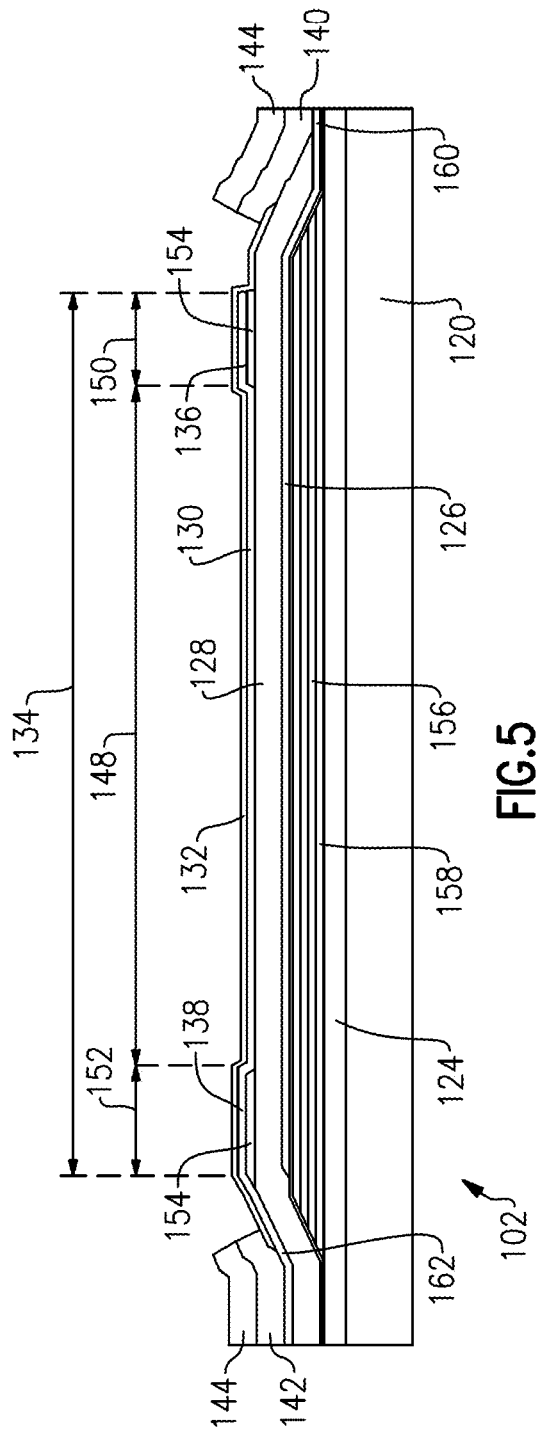
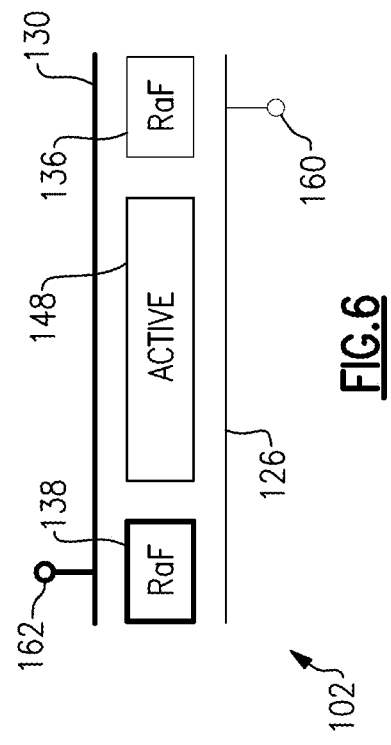

ACOUSTIC WAVE FILTERS WITH IMPROVED SECOND HARMONIC RESPONSE

CROSS REFERENCE TO RELATED APPLICATIONS

This application claims the priority benefit of U.S. Provisional Patent Application No. 63/325,539, filed Mar. 30, 2022 and titled "ACOUSTIC WAVE FILTERS WITH IMPROVED SECOND HARMONIC RESPONSE," and U.S. Provisional Patent Application No. 63/325,547, filed Mar. 30, 2022 and titled "BULK ACOUSTIC WAVE DEVICES WITH SUPPRESSED NONLINEAR RESPONSE," the contents of each of which are hereby incorporated by reference in their entirety.

BACKGROUND

Technical Field

Embodiments of this disclosure relate to filters having acoustic wave devices, such as bulk acoustic wave devices, and more particularly to suppressing nonlinear responses such as second harmonic responses in the acoustic wave devices.

Description of Related Technology

Acoustic wave filters can be implemented in radio frequency electronic systems. For instance, filters in a radio frequency front end of a mobile phone can include acoustic wave filters. An acoustic wave filter can include a plurality of acoustic resonators arranged to filter a radio frequency signal. Example acoustic wave filters include surface acoustic wave (SAW) filters and bulk acoustic wave (BAW) filters.

Although various filters with BAW devices exist, there remains a need for improved filters with BAW devices, such as with improved suppression of nonlinear response.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

Various embodiments disclosed herein can relate to a filter, which can include a first acoustic wave device having a piezoelectric layer between a first electrode and a second electrode. The first acoustic wave device can have a first shape and a first area. A second acoustic wave device can be coupled to the first acoustic wave device to at least partially cancel a second harmonic response of the first acoustic wave device. The second acoustic wave device can have a piezoelectric layer between a first electrode and a second electrode. The second acoustic wave device can have a second shape that is different from the first shape and a second area that can be within about 10% of the first area.

The first acoustic wave device can have a first perimeter length, and the second acoustic wave device can have a second perimeter length that is within about 10% of the first perimeter length. The first acoustic wave device can include a first raised frame on a first side of the first acoustic wave device and a second raised frame on a second side of the first acoustic wave device. The second acoustic wave device can include a first raised frame on a first side of the second acoustic wave device and a second raised frame on a second side of the second acoustic wave device. A perimeter portion length of the first raised frame on the first acoustic wave device can be within about 10% of a perimeter portion length of the first raised frame on the second acoustic wave device, and/or a perimeter portion length of the second raised frame on the first acoustic wave device can be within about 10% of a perimeter portion length of the second raised frame on the second acoustic wave device. The first raised frame of the first acoustic wave device can have a first raised frame area, the second raised frame of the first acoustic wave device can have a second raised frame area, the first raised frame of the second acoustic wave device can have a first raised frame area, the second raised frame of the second acoustic wave device can have a second raised frame area, the first raised frame area of the first acoustic wave device can be within about 10% of the first raised frame area of the second acoustic wave device, and/or the second raised frame area of the first acoustic wave device can be within about 10% of the second raised frame area of the second acoustic wave device. The first acoustic wave device can have an inner active area between the first raised frame and the second raised frame, the second acoustic wave device can have an inner active area between the first raised frame and the second raised frame, and the size of the inner active area of the first acoustic wave device can be within about 10% of the size of the inner active area of the second acoustic wave device.

The first acoustic wave device can have a first electrically conductive layer that is electrically coupled to the first electrode along a first electrical connection having a first electrode connection length, the first acoustic wave device has a second electrically conductive layer that is electrically coupled to the second electrode along a second electrical connection having a second electrode connection length, the second acoustic wave device has a first electrically conductive layer that is electrically coupled to the first electrode along a first electrical connection having a first electrode connection length, the second acoustic wave device has a second electrically conductive layer that is electrically coupled to the second electrode along a second electrode connection length, the first electrode connection length of the first acoustic wave device is within about 10% of the first electrode connection length of the second acoustic wave device, and the second electrode connection length of the first acoustic wave device is within about 10% of the second electrode connection length of the second acoustic wave device.

The first acoustic wave device can be electrically coupled to the second acoustic wave device so that electrical current flows through the first acoustic wave device and the second acoustic wave device in opposite directions. The first acoustic wave device and the second acoustic wave device can have opposite voltage polarities across the piezoelectric layer. The first acoustic wave device can be coupled in series with the second acoustic wave device with either i) the first electrode of the first acoustic wave device electrically coupled to the first electrode of the second acoustic wave device, or ii) the second electrode of the first acoustic wave device electrically coupled to the second electrode of the second acoustic wave device. The filter can include a third acoustic wave device that can have a piezoelectric layer between a first electrode and a second electrode. The third acoustic wave device can have a third shape and a third area. The filter can include a fourth acoustic wave device which can have a piezoelectric layer between a first electrode and a second electrode. The fourth acoustic wave device can have a fourth shape that is different from the third shape and a fourth area that can be within about 10% of the third area. The fourth acoustic wave device can be coupled in series with the third acoustic wave device. The pair of the first and second acoustic wave devices can be coupled in parallel with the pair of the third and fourth acoustic wave devices. The first acoustic wave device can be coupled in parallel with the second acoustic wave device, and/or the first electrode of the first acoustic wave device electrically can be coupled to the second electrode of the second acoustic wave device. The filter can include a third acoustic wave device that can have a piezoelectric layer between a first electrode and a second electrode. The third acoustic wave device can have a third shape and a third area. The filter can include a fourth acoustic wave device that can have a piezoelectric layer between a first electrode and a second electrode. The fourth acoustic wave device can have a fourth shape that is different from the third shape and a fourth area that can be within about 10% of the third area. The fourth acoustic wave device can be coupled in parallel with the third acoustic wave device. The pair of the first and second acoustic wave devices can be coupled in series with the pair of the third and fourth acoustic wave devices. The first area, the second area, the third area, and the fourth area can vary by not more than about 10%. The first acoustic wave device can have a first perimeter length, the second acoustic wave device can have a second perimeter length, the third acoustic wave device can have a third perimeter length, and the fourth acoustic wave device can have a fourth perimeter length. The first perimeter length, the second perimeter length, the third perimeter length, and the fourth perimeter length can vary by not more than about 10%.

The first acoustic wave device can include a substrate, and the first electrode can be between the piezoelectric layer and the substrate. The second acoustic wave device can include a substrate, and the first electrode can be between the piezoelectric layer and the substrate. The first acoustic wave device can be a bulk acoustic wave device, and the second acoustic wave device can be a bulk acoustic wave device.

Various embodiments disclosed herein can relate to a system, which can include a first bulk acoustic wave resonator that can include a substrate, a first electrode, a piezoelectric layer, and a second electrode. The piezoelectric layer can be between the first electrode and the second electrode. The first electrode can be between the piezoelectric layer and the substrate. The first bulk acoustic wave resonator can have a first shape, a first area, and a first perimeter length. The system can include a second bulk acoustic wave resonator that can include a substrate, a first electrode; a piezoelectric layer, and a second electrode. The piezoelectric layer can be between the first electrode and the second electrode. The first electrode can be between the piezoelectric layer and the substrate. The second bulk acoustic wave resonator can have a second shape that is different from the first shape, a second area that can vary by not more than about 10% from the first area, and a second perimeter length that can vary by not more than about 10% from the first perimeter length.

The first bulk acoustic wave device can include a first raised frame on a first side of the first bulk acoustic wave device with a first length and a second raised frame on a second side of the first bulk acoustic wave device with a second length. The second bulk acoustic wave device can include a first raised frame on a first side of the second bulk acoustic wave device and a second raised frame on a second side of the second bulk acoustic wave device. The first length of the first raised frame on the first bulk acoustic wave device can be within about 10% of the first length of the first raised frame on second bulk acoustic wave device. The second length of the second raised frame on the first bulk acoustic wave device can be within about 10% of second length of the second raised frame on the second acoustic wave device. The first bulk acoustic wave device can have an inner active area disposed inward of the first raised frame and the second raised frame. The second acoustic wave device can have an inner active area disposed inward of the first raised frame and the second raised frame. The size of the inner active area of the first acoustic wave device can be within about 10% of the size of the inner active area of the second acoustic wave device.

The first bulk acoustic wave device can have a first nonlinear response. The second bulk acoustic wave device can have a second nonlinear response. The first and second bulk acoustic wave devices can be coupled to at least partially cancel a first and second nonlinear responses. The first electrode of the first bulk acoustic wave device can be electrically coupled to the first electrode of the second bulk acoustic wave device, or the second electrode of the first bulk acoustic wave device can be electrically coupled to the second electrode of the second bulk acoustic wave device, such as to electrically couple the first and second bulk acoustic wave devices in series. The first electrode of the first bulk acoustic wave device can be coupled to the second electrode of the second bulk acoustic wave device, and the second electrode of the first bulk acoustic wave device can be coupled to the first electrode of the second bulk acoustic wave device, such as to electrically couple the first and second bulk acoustic wave devices in parallel.

Various embodiments disclosed herein can relate to an acoustic wave filter that can include a first bulk acoustic wave resonator that can include a piezoelectric layer between a lower electrode and an upper electrode. The first bulk acoustic wave resonator can have a first shape and a first perimeter length. A second bulk acoustic wave resonator can have a piezoelectric layer between a lower electrode and an upper electrode. The second bulk acoustic wave resonator can have a second shape that can be different from the first shape and a second perimeter length that can vary by not more than about 10% from the first perimeter length.

The second bulk acoustic wave resonator can be configured to at least partially cancel a second harmonic response of the first bulk acoustic wave resonator. The first bulk acoustic wave resonator can be electrically coupled to the second bulk acoustic wave resonator so that electrical current flows through the first bulk acoustic wave resonator from the upper electrode to the lower electrode, and so that electrical current flows through the second bulk acoustic wave resonator from the lower electrode to the upper electrode. The first bulk acoustic wave resonator can be electrically coupled to the second bulk acoustic wave resonator to provide a voltage drop from the upper electrode to the lower electrode in the first bulk acoustic wave resonator and to provide a voltage drop from the lower electrode to the upper electrode in the second bulk acoustic wave resonator. An active region of the first bulk acoustic wave resonator where the lower electrode, the piezoelectric layer, and the upper electrode overlap can have a first area. An active region of the second bulk acoustic wave resonator where the lower electrode, the piezoelectric layer, and the upper electrode overlap can have a second area that can vary by not more than about 10% from the first area.

The first bulk acoustic wave resonator can include a first raised frame on a first side of the first bulk acoustic wave resonator and the lower electrode can extend outward past the piezoelectric layer. The first raised frame of the first bulk acoustic wave resonator can have a first length and a first area. The first bulk acoustic wave resonator can include a second raised frame on a second side of the first bulk acoustic wave resonator and the upper electrode can extend outward past the piezoelectric layer. The second raised frame of the first bulk acoustic wave resonator can have a second length and a second area. The second bulk acoustic wave resonator can include a first raised frame on a first side of the second bulk acoustic wave resonator and the lower electrode can extend outward past the piezoelectric layer. The first raised frame of the second bulk acoustic wave device can have a third length and a third area. The second bulk acoustic wave resonator can include a second raised frame on a second side of the second bulk acoustic wave resonator and the upper electrode can extend outward past the piezoelectric layer. The second raised frame of the second bulk acoustic wave device can have a fourth length and a fourth area. In some embodiments, either i) the upper electrode of the first bulk acoustic wave resonator can be electrically coupled to the upper electrode of the second bulk acoustic wave resonator, or ii) the lower electrode of the first bulk acoustic wave resonator can be electrically coupled to the lower electrode of the second bulk acoustic wave resonator, such as to electrically couple the first and second bulk acoustic wave resonator in series. The first length and/or the first area of the first raised frame on the first bulk acoustic wave resonator can be within about 10% of the third length and/or third area of the first raised frame on the second bulk acoustic wave resonator. The second length and/or second area of the second raised frame on the first bulk acoustic wave resonator can be within about 10% of the fourth length and/or fourth area of the second raised frame on the second acoustic wave resonator. In some embodiments, either i) the lower electrode of the first bulk acoustic wave resonator can be coupled to the upper electrode of the second bulk acoustic wave resonator, or ii) the upper electrode of the first bulk acoustic wave resonator can be coupled to the lower electrode of the second bulk acoustic wave device, such as to electrically couple the first and second bulk acoustic wave resonators in parallel. The first length and/or the first area of the first raised frame on the first bulk acoustic wave resonator can be within about 10% of the fourth length and/or fourth area of the second raised frame on the second bulk acoustic wave resonator. The second length and/or second area of the second raised frame on the first bulk acoustic wave resonator can be within about 10% of the third length and/or third area of the first raised frame on the second acoustic wave resonator. The first bulk acoustic wave resonator can have a main acoustically active area disposed inward of the first raised frame and the second raised frame. The second acoustic wave resonator can have a main acoustically active area inward of the first raised frame and the second raised frame. An area of the main acoustically active area of the first acoustic wave device can be within about 10% of an area of the main acoustically active area of the second acoustic wave device.

Various embodiments disclosed herein can relate to a filter that can include first and second bulk acoustic wave devices that each can include a piezoelectric layer between a lower electrode and an upper electrode, an active region with an overlap shape where the lower electrode, piezoelectric layer, and upper electrode overlap, a first conductive layer that is electrically coupled to a portion of the lower electrode and that extends laterally past the active region on a first side of the bulk acoustic wave device, a second conductive layer that is electrically coupled to a portion of the upper electrode that extends laterally past the active region on a second side of the bulk acoustic wave device, a first raised frame structure on the first side of the bulk acoustic wave device, and a second raised frame structure on the second side of the bulk acoustic wave device. The second bulk acoustic wave device can be coupled to the first bulk acoustic wave device to at least partially cancel a second harmonic response of the first bulk acoustic wave device. The overlap shape of the second bulk acoustic wave device can have a second shape different from a first shape of the overlap shape of the first bulk acoustic wave device.

The first raised frame structure of the first bulk acoustic wave device can have a first length extending from a first end to a second end of the first raised frame structure. The second raised frame structure of the first bulk acoustic wave device can have a second length extending from a first end to a second end of the second raised frame structure. The first raised frame structure of the second bulk acoustic wave device can have a third length extending from a first end to a second end of the first raised frame structure. The second raised frame structure of the second bulk acoustic wave device can have a fourth length extending from a first end to a second end of the second raised frame structure. The third length can be is within about 10% of the first length. The fourth length can be within about 10% of the second length. In some embodiments, either i) the first conductive layer of the first bulk acoustic wave device can be electrically coupled to the first conductive layer of the second bulk acoustic wave device, or ii) the second conductive layer of the first bulk acoustic wave device can be electrically coupled to the second conductive layer of the second bulk acoustic wave device, such as so that the first and second bulk acoustic wave devices are coupled in series. The third length can be within about 10% of the second length. The fourth length can be within about 10% of the first length. In some embodiments, either i) the first conductive layer of the first bulk acoustic wave device can be electrically coupled to the second conductive layer of the second bulk acoustic wave device, or ii) the second conductive layer of the first bulk acoustic wave device can be electrically coupled to the first conductive layer of the second bulk acoustic wave device, so that the first and second bulk acoustic wave devices are coupled in parallel. The first bulk acoustic wave device can have a first gap between the first ends of the first and second raised frame structures and a second gap between the second ends of the first and second raised frame structures. The second bulk acoustic wave device can have a first gap between the first ends of the first and second raised frame structures and a second gap between the second ends of the first and second raised frame structures.

An area of the first raised frame structure of the first bulk acoustic wave device can be within about 10% of an area of the first raised frame structure of the second bulk acoustic wave device. An area of the second raised frame structure of the first bulk acoustic wave device can be within about 10% of an area of the second raised frame structure of the second bulk acoustic wave device. In some embodiments, either i) the first conductive layer of the first bulk acoustic wave device can be electrically coupled to the first conductive layer of the second bulk acoustic wave device, or ii) the second conductive layer of the first bulk acoustic wave device can be electrically coupled to the second conductive layer of the second bulk acoustic wave device, so that the first and second bulk acoustic wave devices are coupled in series. An area of the first raised frame structure of the first bulk acoustic wave device can be within about 10% of an area of the second raised frame structure of the second bulk acoustic wave device. An area of the second raised frame structure of the first bulk acoustic wave device can be within about 10% of an area of the first raised frame structure of the second bulk acoustic wave device. In some embodiments, either i) the first conductive layer of the first bulk acoustic wave device is electrically coupled to the second conductive layer of the second bulk acoustic wave device, or ii) the second conductive layer of the first bulk acoustic wave device is electrically coupled to the first conductive layer of the second bulk acoustic wave device, so that the first and second bulk acoustic wave devices are coupled in parallel.

The active region of the first bulk acoustic wave device can have a first area, and the active region of the second bulk acoustic wave device can have a second area that can be within about 10% of the first area. The active region of the first bulk acoustic wave device can have a first perimeter, and the active region of the second bulk acoustic wave device can have a second perimeter that can be within about 10% of the first perimeter. The first bulk acoustic wave device can have a center portion of the active area that is inward of the first raised frame structure and the second raised frame structure, and the center portion can have an area. The second bulk acoustic wave device can have a center portion of the active area that is inward of the first raised frame structure and the second raised frame structure, and the center portion can have an area that can be within about 10% of the area of the center portion of the first bulk acoustic wave device.

The first conductive layer of the first bulk acoustic wave device can be electrically coupled to a portion of the lower electrode along a first electrical connection having a first electrode connection length. The second conductive layer of the first bulk acoustic wave device can be electrically coupled to a portion of the upper electrode along a second electrical connection having a second electrode connection length. A first conductive layer of the second bulk acoustic wave device can be electrically coupled to a portion of the lower electrode along a first electrical connection having a first electrode connection length that can be within about 10% of the first electrical connection length of the first bulk acoustic wave device. The second conductive layer of the second bulk acoustic wave device can be electrically coupled to a portion of the upper electrode along a second electrical connection having a second electrode connection length that can be within about 10% of the second electrical connection length of the first bulk acoustic wave device. In some embodiments, either i) the first conductive layer of the first bulk acoustic wave device can be electrically coupled to the first conductive layer of the second bulk acoustic wave device, or ii) the second conductive layer of the first bulk acoustic wave device can be electrically coupled to the second conductive layer of the second bulk acoustic wave device, so that the first and second bulk acoustic wave devices are coupled in series. The first conductive layer of the first bulk acoustic wave device can be electrically coupled to a portion of the lower electrode along a first electrical connection having a first electrode connection length. The second conductive layer of the first bulk acoustic wave device can be electrically coupled to a portion of the upper electrode along a second electrical connection having a second electrode connection length. A first conductive layer of the second bulk acoustic wave device can be electrically coupled to a portion of the lower electrode along a first electrical connection having a first electrode connection length that can be within about 10% of the second electrical connection length of the first bulk acoustic wave device. The second conductive layer of the second bulk acoustic wave device can be electrically coupled to a portion of the upper electrode along a second electrical connection having a second electrode connection length that can be within about 10% of the first electrical connection length of the first bulk acoustic wave device. In some embodiments, either i) the first conductive layer of the first bulk acoustic wave device can be electrically coupled to the second conductive layer of the second bulk acoustic wave device, or ii) the second conductive layer of the first bulk acoustic wave device can be electrically coupled to the first conductive layer of the second bulk acoustic wave device, so that the first and second bulk acoustic wave devices are coupled in parallel.

The filter can include a third bulk acoustic wave device and a fourth bulk acoustic wave device. The combined first bulk acoustic wave device, second bulk acoustic wave device, third bulk acoustic wave device, and fourth bulk acoustic wave device can have a combined second harmonic response that is smaller than a second harmonic response of any individual one of the first bulk acoustic wave device, the second bulk acoustic wave device, the third bulk acoustic wave device, and the fourth bulk acoustic wave device.

Various embodiments disclosed herein can relate to a filter, which can include first and second bulk acoustic wave devices, which each can include a piezoelectric layer between a lower electrode and an upper electrode, a first conductive layer electrically coupled to a portion of the lower electrode along a first electrical connection having a first electrode connection length, and a second conductive layer electrically coupled to a portion of the upper electrode along a second electrical connection having a second electrode connection length. The second bulk acoustic wave device can have a second shape different from a first shape of the first bulk acoustic wave device. The second bulk acoustic wave device can be coupled to the first bulk acoustic wave device to at least partially cancel a second harmonic response of the first bulk acoustic wave device. The first electrode connection length of the second bulk acoustic wave device can be within about 10% of the first electrical connection length of the first bulk acoustic wave device. The second electrode connection length of the second bulk acoustic wave device can be within about 10% of the second electrical connection length of the first bulk acoustic wave device.

The first bulk acoustic wave device can have an active region where the lower electrode, piezoelectric layer, and upper electrode overlap, and the active region of the first bulk acoustic wave device can have a first area. The second bulk acoustic wave device can have an active areas where the lower electrode, piezoelectric layer, and upper electrode overlap, and the active region of the first bulk acoustic wave device can have a second area that can be within about 10% of the first area. The first bulk acoustic wave device can have an active region where the lower electrode, piezoelectric layer, and upper electrode overlap, and the active region of the first bulk acoustic wave device can have a first perimeter length. The second bulk acoustic wave device can have an active area where the lower electrode, piezoelectric layer, and upper electrode overlap, and the active region of the second bulk acoustic wave device having a second perimeter length that is within about 10% of the first perimeter length. In some embodiments, either i) the first conductive layer of the first bulk acoustic wave device can be electrically coupled to the first conductive layer of the second bulk acoustic wave device, or ii) the second conductive layer of the first bulk acoustic wave device can be electrically coupled to the second conductive layer of the second bulk acoustic wave device, so that the first and second bulk acoustic wave devices can be coupled in series. In some embodiments, the first conductive layer of the first bulk acoustic wave device can be electrically coupled to the second conductive layer of the second bulk acoustic wave device, and the second conductive layer of the first bulk acoustic wave device can be electrically coupled to the first conductive layer of the second bulk acoustic wave device, so that the first and second bulk acoustic wave devices can be coupled in parallel.

Various embodiments disclosed herein can relate to a radio frequency filter, which can include a plurality of bulk acoustic wave devices. Each of the plurality of bulk acoustic wave devices can be coupled to at least one other of the plurality of bulk acoustic wave devices to at least partially cancel a second harmonic response of the at least one other of the plurality of bulk acoustic wave devices. Each of the plurality of bulk acoustic wave devices can have a piezoelectric layer between a first electrode and a second electrode. Each of the plurality of bulk acoustic wave devices can have a unique shape that is different from all the other bulk acoustic wave devices of the filter.

The plurality of bulk acoustic wave devices can include at least 2, at least 3, at least 4, at least 6, at least 8, at least 10, at least 12, or more bulk acoustic wave devices with unique shapes. The plurality of bulk acoustic wave devices can includes at least two bulk acoustic wave devices that are coupled to at least partially cancel each other's second harmonic responses. The at least two bulk acoustic wave devices can have different shapes and can have sizes that differ by not more than about 10%. The at least two bulk acoustic wave devices can have perimeters that differ by not more than about 10%. The at least two bulk acoustic wave devices can each have two raised frame structures with areas that can differ from corresponding areas of two raised frame structures on the others of the at least two bulk acoustic wave devices by not more than about 10%. The at least two bulk acoustic wave devices can each have two raised frame structures with lengths that differ from corresponding lengths of two raised frame structures on the others of the at least two bulk acoustic wave devices by not more than about 10%. The at least two of the plurality of bulk acoustic wave devices can be coupled in series as resonator sub-elements of a resonator of the filter. At least two of the plurality of bulk acoustic wave devices can be coupled in parallel as resonator sub-elements of a resonator.

The various different parameters that are identified as being within about 10% or as varying by not more than 10%, or the like, can be within or can vary by not more than about 10%, about 8%, about 6%, about 5%, about 4%, about 3%, about 2%, about 1%, about 0.75%, about 0.5%, about 0.25%, about 0.2%, about 0.15%, about 0.1%, or less, or any values or ranges between any of these values.

BRIEF DESCRIPTION OF THE DRAWINGS

Embodiments of this disclosure will now be described, by way of non-limiting example, with reference to the accompanying drawings.

FIG. 3 is a cross-sectional view of an example of a BAW device.

FIG. 4 is a plan view of an example of a BAW device.

FIG. 5 is a cross-sectional view of an example of a BAW device.

FIG. 6 is a schematic illustration of a BAW device.

DETAILED DESCRIPTION

Figure 1:
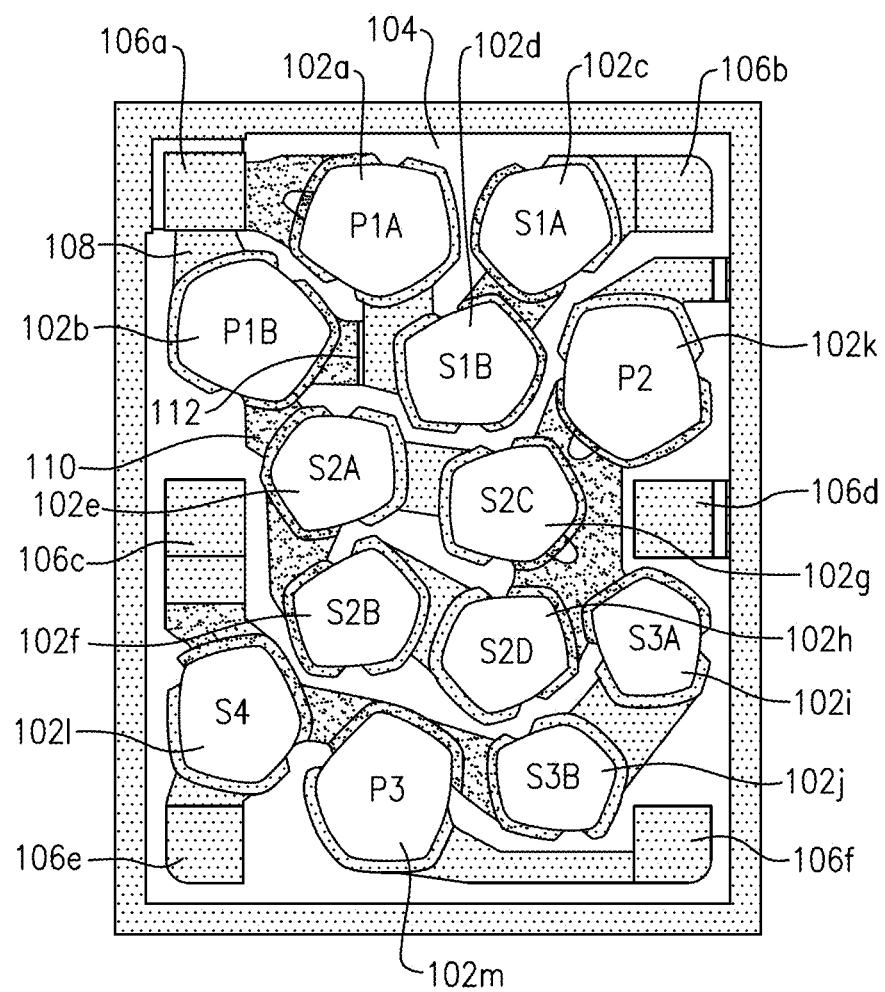
FIG. 1 is a plan view of an example of a filter with acoustic wave devices.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Acoustic resonators, including bulk acoustic wave (BAW) resonators, can be used in radio frequency (RF) filters and communications systems. In some filter configurations, one or more BAW resonators can have non-linear behavior, such as a second harmonic response (H2). In general it can be advantageous for the second harmonic response, and/or other nonlinear responses, to be as low as possible. In some embodiments, BAW resonators can be cascaded in a manner than removes or reduces the H2 response. For example, a resonator of the filter can include two resonator sub-elements. A first of the two resonator sub-elements can produce a first H2 response, and the second of the two resonator sub-elements can produce a second H2 response that at least partially cancels the first H2 response. Accordingly, the total H2 response of the resonator can be reduced or removed.

Figure 2:
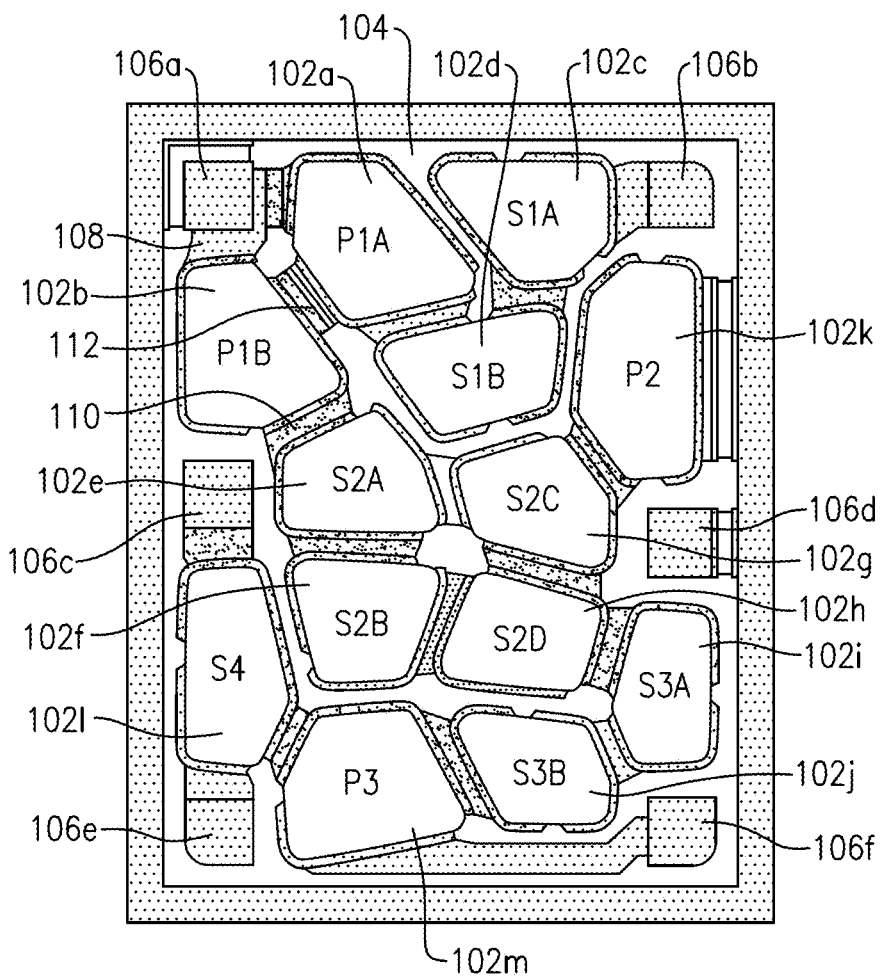
FIG. 2 is a plan view of an example of a filter with acoustic wave devices.

FIG. 1 is a plan view of an example of a layout for an acoustic wave filter 100. FIG. 2 is a plan view of another example implementation of an acoustic wave filter 100. The filter 100 can include a plurality of acoustic wave devices 102, such as BAW resonators or devices 102a-m, which can be coupled to a die 104, substrate, or base material. The example of FIG. 1 has 13 BAW resonators 102a-m, but any suitable number of BAW resonators can be used. Some layers and components of the filter 100 are omitted from view in FIG. 1 for ease of illustration. The filter 100 can have one or more connection points 106a-f, such as contact pads, which can be used, for example, to deliver input signals to, or to receive output signals from, the filter 100. The filter 100 can include electrical connections 108, 110 between the BAW devices 102a-m. The filter 100 can include lower electrical connections 108 to the lower electrodes of the BAW devices 102a-m, which is shown in FIG. 1 with a first pattern (e.g., in the periodic speckle pattern), and upper electrical connections 110 to the upper electrodes of the BAW devices 102a-m, which is shown in FIG. 1 with a second pattern (e.g., in the irregular speckle pattern). In FIGS. 1, 2, 4, 7, 9, and 11, the periodic speckle pattern is used to indicate the lower electrical connections 108 to the lower electrodes, and the irregular speckle pattern is used to indicate the upper electrical connections 110 to the upper electrodes. In some cases, the filter 100 can include one or more electrical couplings 112 between the lower electrical connection 108 and the upper electric connection 110. The electrical coupling 112 can be accomplished using one or more vias, other vertical electrical couplings, or any other suitable electrical coupling mechanism or manner. The electrical couplings 112 can be used to couple a lower electrode 126 of one BAW device (e.g., BAW device HA 102a) to an upper electrode 130 of a second BAW device (e.g., BAW device P1B 102b).

FIG. 3 is a cross-sectional view of an example of a bulk acoustic wave (BAW) device 102, which can be used by the filter 100. The BAW device 102 can includes a support substrate 120, a cavity 122, a first or lower electrode 126 positioned over the support substrate 120, a piezoelectric layer 128 positioned over the lower electrode 126, and a second or upper electrode 130 positioned over the piezoelectric layer 128. The support substrate 120 can be a silicon substrate, and other suitable substrates can alternatively be implemented in place of the silicon substrate. One or more layers, such as a passivation layer, can be positioned between the lower electrode 126 and the support substrate 120. In FIG. 3, a passivation layer 124 can be disposed between the substrate 120 and the lower electrode 126. The layer 124 can be an insulating or dielectric material. The layer 124 can be an oxide layer, and can include silicon dioxide, although any suitable material could be used. The layer 124 can be disposed between the substrate 120 and the cavity 122. In some embodiments, a portion of the material of layer 124 can be disposed between the cavity and the first electrode 126 and/or piezoelectric layer 128. The cavity 122 can be a recess formed in the substrate 120 material, or the first electrode 126, piezoelectric layer 128, and/or second electrode 130 can be elevated to provide the cavity 122 (as shown in FIG. 3). In some embodiments, the cavity 122 can be an air cavity.

The piezoelectric layer 128 can be disposed between the first electrode 126 and the second electrode 130. The piezoelectric layer 128 can be an aluminum nitride (AlN) layer or any other suitable piezoelectric layer. The lower electrode 126 and/or the upper electrode 130 can have a relatively high acoustic impedance. For example, the lower electrode 126 and/or the upper electrode 130 can include molybdenum (Mo), tungsten (W), ruthenium (Ru), iridium (Jr), platinum (Pt), Ir/Pt, or any suitable alloy and/or combination thereof, although other suitable conductive materials could be used. The upper electrode 130 can be formed of the same material as the lower electrode 126 in certain instances, although different materials can be used for the lower electrode 126 and the upper electrode 130, in some cases. In some embodiments, a passivation layer 132 can be disposed over the upper electrode 130. The passivation layer 132 can be made of silicon dioxide, although various other insulating or dielectric materials could be used. The passivation layer 132 can be an oxide layer. In some cases, the passivation layer 132 can be omitted.

An active region 134 or active domain of the BAW device 102 can be defined by the portion of the piezoelectric layer 128 that overlaps with both the lower electrode 126 and the upper electrode 130, for example over an acoustic reflector, such as the cavity 122. The BAW device 102 can include a raised frame structure, in some embodiments. The BAW device 102 can have a first raised frame structure 136, which can be on a first side of the BAW device 102 that is electrically coupled to the lower electrode 126. The lower electrode 126 can extend laterally past the active region 134 and/or laterally past the upper electrode 130 on the first side of the BAW device 102. The lower electrode 126 can be in contact with a first conductive layer 140 at a lower electrode connection 160, for example, outside the active region 134. The first conductive layer 140 can be used to transfer electricity to or from the first or lower electrode 126. Electricity can be transferred to or from the first or lower electrode 126 (e.g., via the first conductive layer 140) on the first side of the BAW device 102 that has the first raised frame structure 136. The first raised frame structure 136 can be a lower electrode connected raised frame, for example because the first raised frame structure 136 can be positioned on the side of the BAW device 102 with the electrical connection to the lower electrode 126. The BAW device 102 can have a second raised frame structure 138, which can be on a second side of the BAW device 102 (e.g., in some cases opposite the first side). The second side of the BAW device 102 can be electrically coupled to the upper electrode 130. The upper electrode 130 can extend laterally past the active region 134 and/or laterally past the lower electrode 126 on the second side of the BAW device 102. The upper electrode 130 can be in contact with a second conductive layer 142 at an upper electrode connection 162, for example, outside the active region 134. The second conductive layer 142 can be used to transfer electricity to or from the second or upper electrode 130. A third conductive layer 144 can be formed (e.g., deposited) over the first conductive layer 140 and/or the second conductive layer 142. The additional conductive layer 144 can be beneficial for selecting specific chemical, mechanical, and/or electrical characteristics. In some embodiments, the conductive layers 140 and 142 can be a first conductive material (e.g., gold (Au)), and the additional conductive layer 144 can be a second conductive material (e.g., copper (Cu)). In some embodiments, the additional conductive layer 144 can be omitted. Electricity can be transferred to or from the second or upper electrode 130 (e.g., via the second conductive layer 142) on the second side of the BAW device 102, which has the second raised frame structure 138. The second raised frame structure 138 can be an upper electrode connected raised frame, for example because the second raised frame structure 138 can be positioned on the side of the BAW device 102 with the electrical connection to the upper electrode 130. The electrical connection 160 from the conductive layer 140 to the lower electrode 126 can be the lower electrode perimeter or edge. The electrical connection 162 from the conductive layer 140 to the upper electrode 130 can be the upper electrode perimeter or edge. In some embodiments, the first conductive layer 140 and/or the second conductive layer 142 can be omitted, and the material of the lower electrode 126 and/or the upper electrode 130 can extend beyond the BAW device 102 can deliver signals to and/or the BAW device 102.

FIG. 4 shows a plan view of an example BAW device, which can be the BAW device 102j of FIG. 2, for example. The cross-sectional view of a BAW device 102 can be taken along the line from A to A' in FIG. 4. Gaps 146 can separate the first raised frame structure 136 from the second raised frame structure 138. The raised frame structures 136, 138 can extend along less than the full perimeter of the BAW device 102 or active region 134, such as about 75%, about 80%, about 85%, about 90%, about 93%, about 95%, about 97%, about 98%, about 99% or the full perimeter, or any values or ranges between any of these values. At the gaps 146, the top of the active region 134 can be flat (e.g., flush with a center portion 148 of the active region 134), without the raised portions that provide the raised frame structures 136, 138. The center portion 148 can be a main acoustically active region of the BAW device 102. In some embodiments, the main acoustically active region 148 can set the main resonant frequency of the BAW device 102, and there can be a significant (e.g., exponential) fall off of acoustic energy in the piezoelectric layer 128 for a main mode in the regions of the raised frame structures 136 and 138 relative to the main acoustically active region 148. The first raised frame portion 136 can have a first width 150, which can be substantially the same as a second width 152 of the second raised frame structure 138. The first raised frame structure 136 can have a first height, which can be substantially the same as a second height of the second raised frame structure 138. Other configurations are possible, such as having different heights and/or widths for the raised frame structures 136, 138.

The raised frame structures 136 and/or 138 can be formed by regions of the upper electrode 130 with increased thickness. In some cases, additional conductive material (e.g., the same material as the electrode 130) can be formed over the upper electrode 130 to form the thicker regions to provide the raised frame structures 136, 138. In some embodiments, the upper electrode 130 can have a first thickness at the central portion or main acoustically active region 148, and a second thickness at one or both of the raised frame structures 136, 138, and the second thickness can be greater than the first thickness.

Various other BAW devices could be used. FIG. 5 shows a cross-sectional view of another example embodiment of a BAW device 102. The BAW device 102 can have a raised frame layer 154 positioned at least partially between the piezoelectric layer 128 and the upper electrode 130. A first portion of the raised frame layer 154 can form the first raised frame structure 136. A first raised frame region 150 of the BAW device 102 can be defined by the portion of the first raised frame structure in the active region 134 of the BAW 102. A second portion of the raised frame layer 154 can form the second raised frame structure 138. A second raised frame region 152 of the BAW device 102 can be defined by the portion of the second raised frame structure in the active region 134 of the BAW 102. The raised frame layer 154 can be positioned between the first or lower electrode 126 and the second or upper electrode 130. The raised frame layer 154 can have gaps, which can provide the two separate raised frame structures 136 and 138. The raised frame layer 154 can be positioned over the upper or second electrode 130, in some embodiments. In some embodiments, the raised frame structures 136 and 138 can be formed by a thicken regions of the piezoelectric layer 124, or by thickened regions of the lower electrode 126, or by thickened regions of the upper electrode 130, or by a raised frame layer 154 positioned between the piezoelectric layer 128 and the lower electrode 126, or between the piezoelectric layer 128 and the upper electrode 130, or at any other suitable location to produce the raised frame structures 136, 138 with elevated heights.

In some embodiments, the raised frame layer 154 can be a low acoustic impedance material. The low acoustic impedance material can have a lower acoustic impedance than the material of the first electrode 126. The low acoustic impedance material has a lower acoustic impedance than the material of the second electrode 130. The low acoustic impedance material can have a lower acoustic impedance than the material of the piezoelectric layer 124. As an example, the raised frame layer 154 can be a silicon dioxide (SiO2) layer, although other oxides and other suitable materials can be used. Since silicon dioxide is already used in a variety of bulk acoustic wave devices, a silicon dioxide first raised frame layer 120 can be relatively easy to manufacture. The first raised frame layer 120 can have a relatively low density. The density and/or acoustic impedance of the first raised frame layer 120 can be lower than the density and/or acoustic impedance of the lower electrode 114, of the upper electrode 118, of the piezoelectric layer 116.

In some embodiments, the raised frame layer 154 can be a relatively high acoustic impedance material. The raised frame layer 154 can include a relatively high density material. For instance, the raised frame layer 154 can include molybdenum (Mo), tungsten (W), ruthenium (Ru), platinum (Pt), iridium (Ir), the like, or any suitable alloy thereof. The raised frame layer 154 can be a metal layer. Alternatively, the raised frame layer 154 can be a suitable non-metal material with a relatively high density. The density and/or acoustic impedance of the raised frame layer 154 can be similar to or greater than the density and/or acoustic impedance of the lower electrode 114, of the upper electrode 118, and/or of the piezoelectric layer 116 of the BAW device 102. In some instances, the raised frame layer 154 can be of the same material as the lower electrode 114 and/or the upper electrode 118 of the BAW device 102. In some implementations, the raised frame layer 154 can be a thickened region of the same material that makes up the upper electrode 130. The upper electrode 130 and the raised frame layer 154 can be formed by different processing steps, and in some cases there can be a resulting identifiable transition between the upper electrode 130 and the raised frame layer 154 of the same material, although some implementations may not have an identifiable transition between the upper electrode 130 and the raised frame layer 154. In some embodiments, the raised frame structure can include a layer of a relatively low acoustic impedance material, and a layer of relatively high acoustic impedance. Any suitable raised frame structures 136, 138 can be used.

The BAW devices 102 disclosed herein can be film bulk acoustic wave resonators (FBARs), as illustrated in FIG. 3, for example. A cavity 122 can be included, such as below the first or lower electrode 126. The cavity 122 can be filled with air, in some implementations. The cavity 122 can be defined by the geometry of the first electrode 126 and/or the substrate 120. The cavity 122 can be an acoustic reflector cavity.

Although some of the BAW devices illustrated and described herein are FBAR devices, any suitable principles and advantages discussed herein can be applied to a solidly mounted resonator (SMR). FIG. 5 is a cross-sectional view of an example embodiment of a BAW device 102, which can have similarities with the BAW device 102 of FIG. 3. The BAW device 102 of FIG. 5 can be an SMR instead of an FBAR. In the BAW device 102 of FIG. 5, a solid acoustic mirror can be disposed between the first electrode 126 and a silicon substrate 120. The illustrated acoustic mirror includes acoustic Bragg reflectors. The illustrated acoustic Bragg reflectors include alternating low impedance layers 156 and high impedance layers 158. As an example, the Bragg reflectors can include alternating silicon dioxide layers as low impedance layers 156 and tungsten layers as high impedance layers 158, although other suitable materials could be used. Any other embodiments disclosed herein can use SMR devices. Various other suitable configurations of BAW devices can be used.

FIG. 6 shows a schematic diagram of a BAW device 102, such as the BAW devices of FIG. 4 or FIG. 5. FIG. 6 schematically shows the main acoustically active region 148, the first or lower electrode 126, the second or upper electrode 130, lower electrode connection 160, an upper electrode connection 162, a first or lower-electrode-connected raised frame 136, and a second or upper-electrode-connected raised frame 138. In FIGS. 6, 8, 10, 12, and 13, the lower electrode 126 and the lower-electrode-connected raised frame 136 are shown in a lighter line weight, whereas the upper electrode 130 and the upper-electrode-connected raised frame 138 are shown in a heavier line weight.

With reference to FIGS. 1 and 2, the BAW resonators 102a-m can be arranged as a ladder filter, or a lattice filter, although any suitable type of filter could be used. A filter 100, such as a ladder filter, can include multiple resonators coupled in series, and multiple resonators (e.g., shunt resonators) coupled in parallel. In some embodiments, one resonator of the filter 100 can include multiple resonator sub-elements, which can operate together as a single resonator. The grouped resonators or resonator sub-elements can be configured to at least partially cancel each other's non-linear responses (e.g., second harmonic responses). For example a first BAW device (e.g., P1A 102a, S1A 102c, or S3A 102i) can produce a first nonlinear response (e.g., a second harmonic response), and a second BAW device (e.g., P1B 102b, S1B 102d, or S3B 102j) can produce a second nonlinear response (e.g., a different second harmonic response) that at least partially counters the first nonlinear response. The second harmonic response for the joint resonator that includes multiple resonator sub-elements can be lower than the second harmonic response of any one of the resonator sub-elements alone. As discussed herein, in some embodiments, the current can flow in opposite directions through the two BAW devices, and/or the voltage polarity across the two BAW devices can be opposite, so that the second harmonic responses of the two BAW devices at least partially cancel. In some embodiments, the filter 100 can have BAW devices (e.g., P2 102k, S4 102l, and P3 102m) that are not grouped with other resonator sub-elements, and/or are not part of an H2 canceling pair or group. In some embodiments, a resonator can have two resonator sub-elements, as discussed. In other embodiments, a resonator can have more than two resonator sub-elements, such as four, six, or eight, or any suitable number of resonator sub-elements.

Figure 7:
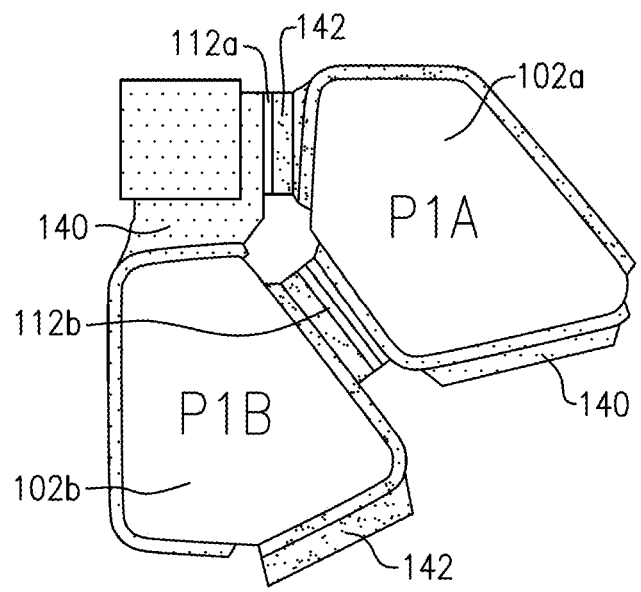
FIG. 7 is a plan view of a resonator with multiple BAW devices.
Figure 8:
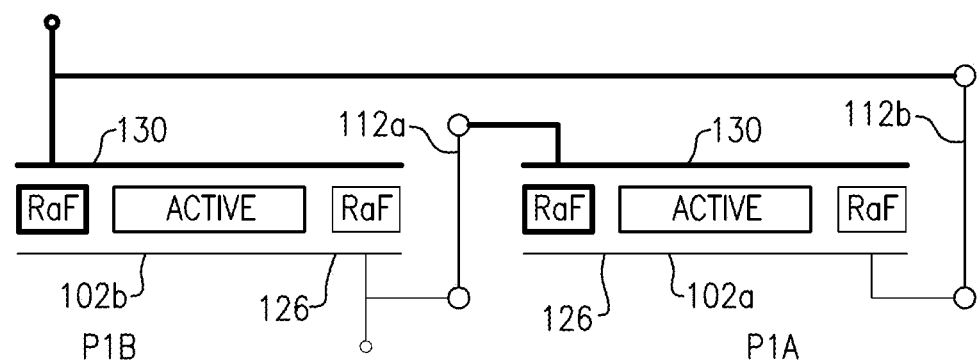
FIG. 8 is a schematic illustration of a resonator with multiple BAW devices.

By way of example, in FIGS. 1 and 2, the BAW devices P1A 102a and P1B 102b can be resonator sub-elements of a single resonator of a filter (e.g., a ladder filter). FIG. 7 shows a plan view of the BAW devices 102a and 102b, isolated from other components of the filter 100. FIG. 8 is a schematic illustration of the BAW devices 102a and 102b as resonator sub-elements coupled together to form a resonator, which can have a reduced non-linear (e.g., second harmonic) response. The BAW devices P1A 102a and P1B 102b can function as one resonator with the combined area of P1A 102a and P1B 102b (e.g., twice the size of a single one of P1A 102a or P1B 102b). The BAW devices P1A 102a and P1B 102b can be coupled in parallel. The BAW devices P1A 102a and P1B 102b can be arranged to have opposite voltage polarity. The upper electrode 130 of a first BAW device HA 102a can be electrically coupled to a lower electrode 126 of a second BAW device P1B 102b, such as by a via or other electrical coupling 112a. The lower electrode 126 of the first BAW device HA 102a can be electrically coupled to an upper electrode 130 of a second BAW device P1B 102b, such as by a via or other electrical coupling 112b. In some embodiments, a voltage across the first resonator sub-element (e.g., BAW device P1A 102a) can have substantially the same quantity and an opposite polarity as a voltage across the second resonator sub-element (e.g., BAW device P1B 102b). A voltage drop or change from the upper electrode 130 to the lower electrode 126 for the first BAW device P1A 102a and be substantially the same as a voltage drop or change from the lower electrode 126 to the upper electrode 130 of the second BAW device P1B 102b. The opposite polarity of the voltages across the BAW devices P1A 102a and P1B 102b can cause the nonlinear responses (e.g., second harmonic responses) of the BAW devices P1A 102a and P1B 102b to at least partially cancel each other.

Figure 9:
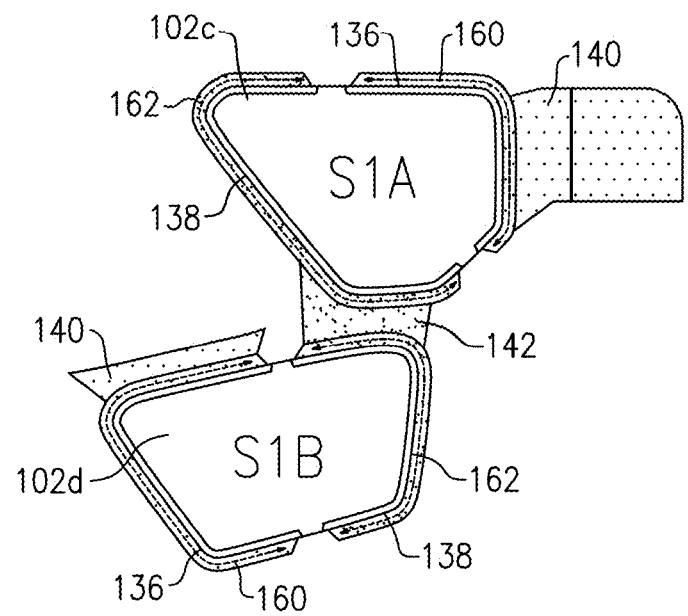
FIG. 9 is a plan view of a resonator with multiple BAW devices.
Figure 10:
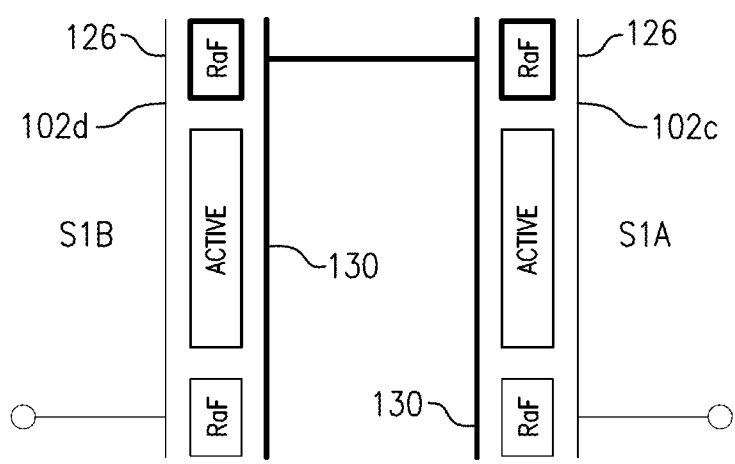
FIG. 10 is a schematic illustration of a resonator with multiple BAW devices.

As another example, in FIGS. 1 and 2, the BAW devices S1A 102c and S1B 102d can be resonator sub-elements of a single resonator of a filter (e.g., a ladder filter). FIG. 9 shows a plan view of the BAW devices S1A 102c and S1B 102d, isolated from the other components of the filter 100. FIG. 10 shows a schematic illustration of the BAW devices S1A 102c and S1B 102d as resonator sub-elements coupled together to form a resonator, which can have a reduced non-linear (e.g., second harmonic) response. The BAW devices S1A 102c and S1B 102d can function as one resonator with half the size of S1A 102c or S1B 102d (e.g., twice the size of a single one of S1A 102c or S1B 102d). The BAW devices S1A 102c and S1B 102d can be coupled in series. The BAW devices S1A 102c and S1B 102d can be arranged to have opposite current directions. The upper electrode 130 of a first BAW device S1A 102c can be electrically coupled to the upper electrode 130 of a second BAW device S1B 102d. The current can flow into the bottom electrode 126 and out of the upper electrode 130 for the first BAW device S1A 102c, and the current can flow into the upper electrode 130 and out of the lower electrode 126 for the second BAW device S1B 102d. The current flow could also go in the opposite direction. In some embodiments, a current through the first resonator sub-element (e.g., BAW device S1A 102c) can have substantially the same quantity and an opposite direction as a current through the second resonator sub-element (e.g., BAW device S1B 102*d*). The opposite current through the BAW devices S1A 102*c* and S1B 102*d* can cause the nonlinear responses (e.g., second harmonic responses) of the BAW devices S1A 102*c* and S1B 102*d* to at least partially cancel each other.

As shown in FIGS. 1 and 2, the BAW devices S3A 102*i* and S3B 102*j* are also coupled in series, similar to S1A and S1B, except that BAW devices S3A 102*i* and S3B 102*j* are coupled by electrically connecting the lower electrodes 126, rather than the upper electrodes 130. The BAW devices S3A 102*i* and S3B 102*j* can have opposite current flow, which can cause the nonlinear responses (e.g., second harmonic responses) to at least partially cancel each other. The nonlinear responses (e.g., second harmonic responses) can be reduced for groups of BAW devices by arranging them to have opposite voltages and/or opposite currents.

Figure 11:
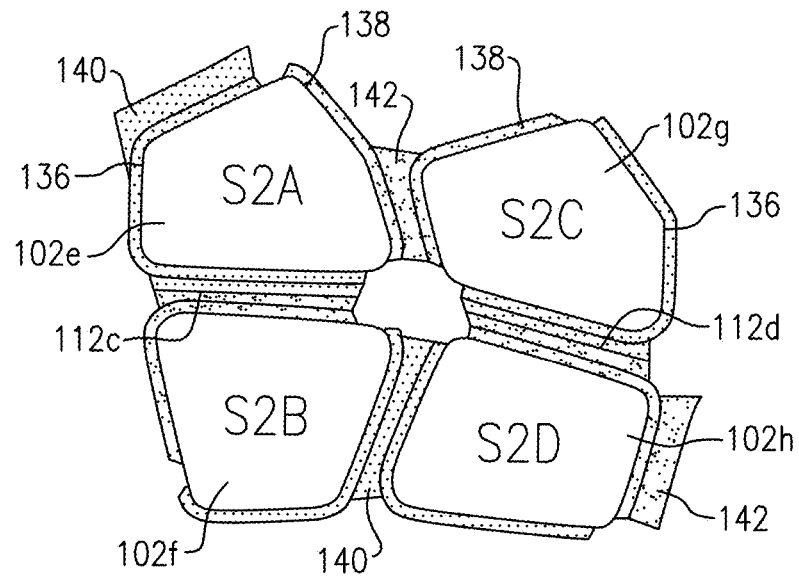
FIG. 11 is a plan view of a resonator with multiple BAW devices.
Figure 12:
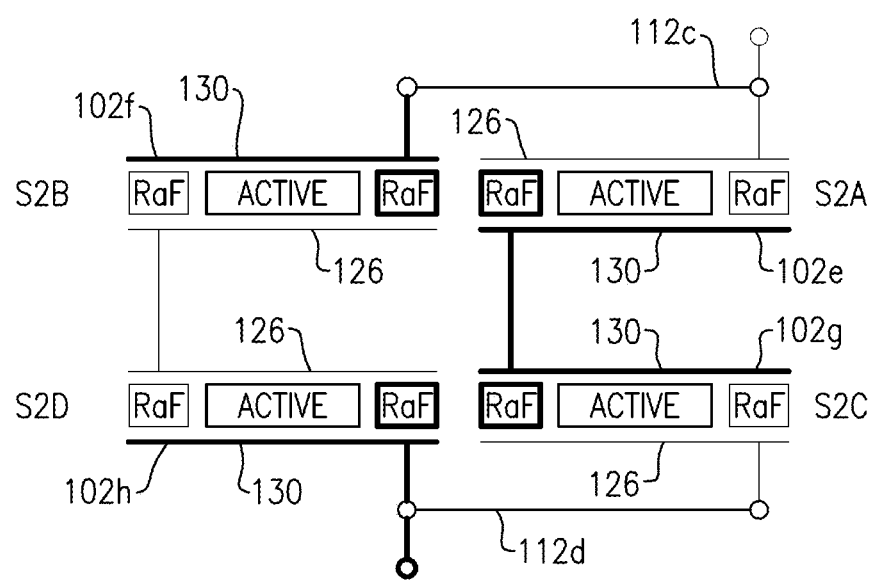
FIG. 12 is a schematic illustration of a resonator with multiple BAW devices.

As shown in FIG. 11, in some embodiments, four BAW devices (e.g., BAW devices S2A 102*e*, S2B 102*f*, S2C 102*g*, and S2D 102*h*) can operate as sub-elements of a single resonator (e.g., of a ladder filter). FIG. 12 shows a schematic illustration of the BAW devices S2A 102*e*, S2B 102*f*, S2C 102*g*, and S2D 102*h*. A first pair of BAW devices S2A 102*e* and S2C 102*g* can be coupled in series, and a second pair of BAW devices S2B 102*f* and S2D 102*h* can be coupled in series, and the first pair can be coupled in parallel with the second pair, such as by vias or other electrical connections 112*c* and 112*d*. The nonlinear responses (e.g., second harmonic responses) of the four BAW devices S2A 102*e*, S2B 102*f*, S2C 102*g*, and S2D 102*h* can at least partially cancel each other. The total nonlinear response (e.g., second harmonic response) of the resonator can be smaller than the nonlinear response (e.g., second harmonic response) of any individual one of the four BAW device resonator sub-elements S2A 102*e*, S2B 102*f*, S2C 102*g*, and S2D 102*h*.

Figure 13:
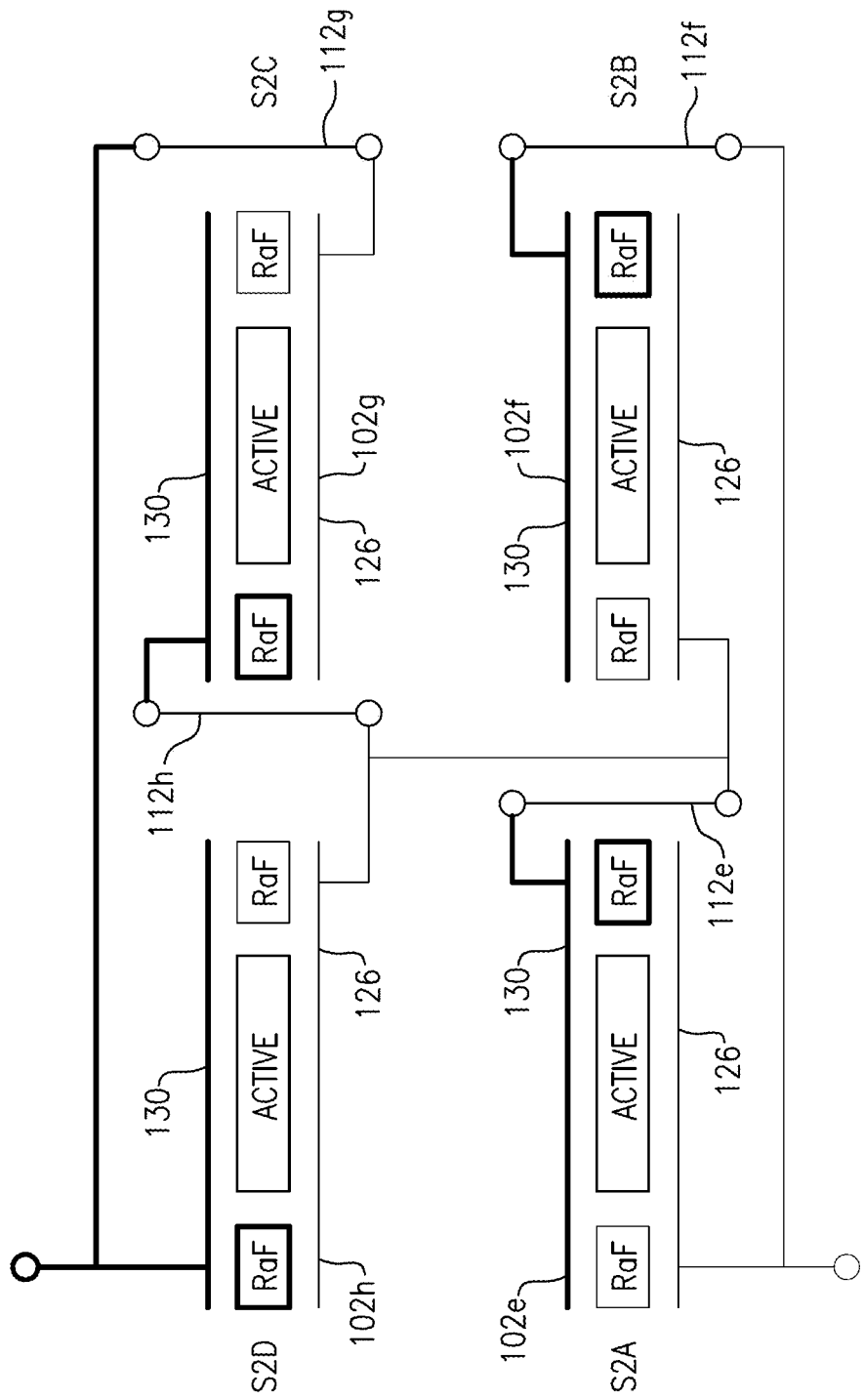
FIG. 13 is a schematic illustration of a resonator with multiple BAW devices.

FIG. 13 shows a schematic illustration of another embodiment with four BAW devices S2A 102*e*, S2B 102*f*, S2C 102*g*, and S2D 102*h*) arranged to operate as sub-elements of a single resonator (e.g., of a ladder filter). A first pair of BAW devices S2A 102*e* and S2B 102*f* can be coupled in parallel, such as by vias or other electrical connections 112*e* and 112*f*. A second pair of BAW devices S2C 102*g* and S2D 102*h* can be coupled in parallel, such as by vias or other electrical connections 112*g* and 112*h*. The first pair of BAW devices S2A 102*e* and S2B 102*f* can be coupled in series with the second pair of BAW devices S2C 102*g* and S2D 102*h*. The bottom electrode 126 of BAW device S2D 102*h* can be electrically coupled to the bottom electrode 126 of the BAW device S2B 102*f*, although various other connections can be used. For example, the upper electrode 130 of BAW device S2D 102*h* can be electrically coupled to the upper electrode 130 of the BAW device S2B 102*f*, or the bottom electrode 126 of BAW device S2C 102*g* can be electrically coupled to the bottom electrode 126 of the BAW device S2A 102*e*, or the upper electrode 130 of BAW device S2C 102*g* can be electrically coupled to the upper electrode 130 of the BAW device S2A 102*e*. The nonlinear responses (e.g., second harmonic responses) of the four BAW devices S2A 102*e*, S2B 102*f*, S2C 102*g*, and S2D 102*h* can at least partially cancel each other. The total nonlinear response (e.g., second harmonic response) of the resonator can be smaller than the nonlinear response (e.g., second harmonic response) of any individual one of the four BAW device resonator sub-elements S2A 102*e*, S2B 102*f*, S2C 102*g*, and S2D 102*h*. Various other configurations can be used to functionally combine BAW devices 102 for use as resonators in a filter 100.

In the example of FIG. 1, the groups of resonator sub-element BAW devices can have substantially the same shape and substantially the same size. For example, in FIG. 1 the BAW devices HA 102*a* and P1B 102*b* can have substantially the same size and shape, and one can be rotated relative to the other. Similarly, the BAW devices S1A and S1B can have substantially the same shape and size, and S2A and S2B can have substantially the same shape and size. Also, each of the four BAW devices S2A 102*e*, S2B 102*f*, S2C 102*g*, and S2D 102*h* can have substantially the same size and shape, with different rotational orientations. In some implementations, using BAW devices with substantially the same size and shape can facilitate reducing or canceling the nonlinear responses (e.g., second harmonic responses). In some embodiments, pentagons or other polygons with rounded corners can be used, although various suitable shapes could be used for the BAW devices. In FIG. 1, the grouped BAW devices can each have the same number of sides, substantially the same side lengths, and substantially the same corner angles.

In the example of FIG. 2, the groups of resonator sub-element BAW devices can have different shapes, while having substantially the same sizes. The different sizes of the BAW devices can enable the BAW devices to be arranged more compactly with less dead-space or with smaller gaps between BAW devices. For example, the arrangement of FIG. 2 (e.g., using different shapes for groups of BAW devices) can have an area that is about 25% smaller than the area of the arrangement of FIG. 1 (e.g., using the same shapes for groups of BAW devices).

The shapes for the BAW devices can be polygons (e.g., with 3, 4, 5, 6, 7, 8, 10, 12, or more sides) with rounded corners, although any suitable shapes can be used. In some cases, the different shapes can have different numbers of sides. For example, the BAW device S1A 102*c* can have 5 sides with rounded corners, and the BAW device S1B can have 4 sides with rounded corners. In some cases, the BAW devices can have the same number of sides, but the sides can have different lengths and/or the corners can have different angles. For example, the BAW device HA 102*a* and the BAW device P1B 102*b* can both have 5 sides with rounded corners, but the sides have different lengths and/or the corners have different angles, so that the resulting shapes are different. If the sides of the grouped BAW devices are listed from shortest to longest, the corresponding sides can differ between the BAW devices by at least about 5%, about 10%, about 15%, about 20%, about 25%, about 30%, about 35%, about 40%, about 45%, about 50%, or more, or any values or ranges between any of these values. If the corner angles of the grouped BAW devices are listed from smallest to largest, the corresponding corner angles can differ between the BAW devices by at least about 5%, about 10%, about 15%, about 20%, about 25%, about 30%, about 35%, about 40%, about 45%, about 50%, or more, or any values or ranges between any of these values.

The cancelation or reduction of the nonlinear responses can depend on the areas and/or perimeters of the resonator elements. To cancel the nonlinear responses for a set of resonator elements, the sizes or resonant areas of the two resonators can be substantially the same. There can be fringing fields at the perimeters of the resonator elements, which can affect the nonlinear responses. Also, changes to the perimeters can change how the current flows through the device and how voltage is applies across a device, which can affect the nonlinear responses. In some cases, the group of resonator elements can all have substantially the same sizes and substantially the same perimeters, even though they can have different shapes, as discussed herein.

The grouped BAW devices (e.g., forming resonator sub-elements of a resonator, such as for a filter) can have substantially the same area, which can facilitate reduction or cancelation of the nonlinear responses of the BAW devices, even though they can have different shapes. For example, the BAW devices HA 102*a* and P1B 102*b* can have substantially the same area. The BAW devices S1A 102*c* and S1B 102*d* can have substantially the same area. The BAW devices S3A 102*i* and S3B 102*j* can have substantially the same area. The BAW devices S2A 102*e*, S2B 102*f*, S2C 102*g*, and S2D 102*h* can all have substantially the same area. The respective areas can have a difference of not more than about 10%, about 8%, about 6%, about 5%, about 4%, about 3%, about 2%, about 1%, about 0.75%, about 0.5%, about 0.25%, about 0.2%, about 0.15%, about 0.1%, or less, or any values or ranges between any of these values. The area that is substantially the same for the BAW devices can be the active area 134, as shown in FIGS. 3 and 5, for example. The area that is substantially the same for the BAW devices can be the center portion or the main acoustically active region 148 (e.g., between the raised frame structures 136 and 138), as shown in FIGS. 3 and 5, for example.

The grouped BAW devices (e.g., forming resonator sub-elements of a resonator, such as for a filter) can have substantially the same perimeter, which can facilitate reduction or cancelation of the nonlinear responses of the BAW devices, even though they can have different shapes. For example, the BAW devices HA 102*a* and P1B 102*b* can have substantially the same perimeter. The BAW devices S1A 102*c* and S1B 102*d* can have substantially the same perimeter. The BAW devices S3A 102*i* and S3B 102*j* can have substantially the same perimeter. The BAW devices S2A 102*e*, S2B 102*f*, S2C 102*g*, and S2D 102*h* can all have substantially the same perimeter. The respective perimeters can have a difference of not more than about 10%, about 8%, about 6%, about 5%, about 4%, about 3%, about 2%, about 1%, about 0.75%, about 0.5%, about 0.25%, about 0.2%, about 0.15%, about 0.1%, or less, or any values or ranges between any of these values. The perimeter that is substantially the same for the BAW devices can be the perimeter around an active area 134 (e.g., outside of the raised frame structures 136 and 138), and/or the perimeter around the center portion or the main acoustically active region 148 (e.g., inside of the raised frame structures 136 and 138).

The grouped BAW devices (e.g., forming resonator sub-elements of a resonator, such as for a filter) can different shapes, but substantially the same areas for the corresponding raised frame structures 136, 138. The respective areas of the corresponding raised frame structures 136, 138 can have a difference of not more than about 10%, about 8%, about 6%, about 5%, about 4%, about 3%, about 2%, about 1%, about 0.75%, about 0.5%, about 0.25%, about 0.2%, about 0.15%, about 0.1%, or less, or any values or ranges between any of these values. The corresponding raised frame structures 136, 138 can have substantially the same widths 150, 152. The respective widths 150, 152 of the corresponding raised frame structures 136, 138 can have a difference of not more than about 10%, about 8%, about 6%, about 5%, about 4%, about 3%, about 2%, about 1%, about 0.75%, about 0.5%, about 0.25%, about 0.2%, about 0.15%, about 0.1%, or less, or any values or ranges between any of these values. The corresponding raised frame structures 136, 138 can have substantially the same lengths 150, 152 (e.g., taken along the perimeters of the BAW device or outside edges of the raised frame structures 136, 138). The respective lengths of the corresponding raised frame structures 136, 138 can have a difference of not more than about 10%, about 8%, about 6%, about 5%, about 4%, about 3%, about 2%, about 1%, about 0.75%, about 0.5%, about 0.25%, about 0.2%, about 0.15%, about 0.1%, or less, or any values or ranges between any of these values.

The corresponding raised frame structures 136, 138 for grouped BAW devices (e.g., that are coupled upper electrode 130 to upper electrode 130 as shown in FIGS. 9 and 10, or that are coupled lower electrode 126 to lower electrode 126) can be the first or lower-electrode-connected raised frame 136 of a first BAW device corresponding to the first or lower-electrode-connected raised frame 136 of the second BAW device, and/or the second or upper-electrode-connected raised frame 138 of the first BAW device corresponding to the second or upper-electrode-connected raised frame 138 of the second BAW device. For example, in FIGS. 2, 11, and 12, the BAW devices S2A 102*e* and S2C 102*g* can have substantially the same lengths for their respective first or lower-electrode-connected raised frames 136. The BAW devices S2A 102*e* and S2C 102*g* can also have substantially the same lengths for their respective second or upper-electrode-connected raised frames 138. One or more of the dimensional features can match between the first raised frame structures 136 of the BAW devices (e.g., periodic speckle pattern or light-line-weight features matched with periodic speckle pattern or light-line-weight features). One or more of the dimensional features can match between the second raised frame structures 138 of the BAW devices (e.g., irregular speckle pattern or heavy-line-weight features matched with irregular speckle pattern or heavy-line-weight features). By way of another example, in FIGS. 2, 9, and 10, the first or lower-electrode-connected raised frame 136 of the BAW device S1A 102*c* and the first or lower-electrode-connected raised frame 136 of the BAW device S1B 102*d* can have substantially the same areas or lengths, and/or the second or upper-electrode-connected raised frame 138 of the BAW device S1A 102*c* and the second or upper-electrode-connected raised frame 138 of the BAW device S1B 102*d* can have substantially the same areas or lengths. The corresponding raised frame areas and/or lengths can be substantially the same, or can vary by the amounts discussed herein.

The corresponding raised frame structures 136, 138 for grouped BAW devices (e.g., that are coupled upper electrode 130 to lower electrode 126, such as through electrical coupling(s) 112*a* and/or 112*b*, as shown in FIGS. 7 and 8) can be the first or lower-electrode-connected raised frame 136 of a first BAW device corresponding to the second or upper-electrode-connected raised frame 138 of the second BAW device, and/or the second or upper-electrode-connected raised frame 138 of the first BAW device corresponding to the first or lower-electrode-connected raised frame 136 of the second BAW device. Thus, in some cases, one or more of the dimensional features can be matched for opposite raised frame structures 136, 138 for the two BAW devices (e.g., irregular speckle pattern or heavy-line-weight features matched with periodic speckle pattern or light-line-weight features). By way of example, in FIGS. 2, 7, and 8, the first or lower-electrode-connected raised frame 136 of the BAW device P1A 102*a* and the second or upper-electrode-connected raised frame 138 of the BAW device P1B 102*b* can have substantially the same areas or lengths, and/or the second or upper-electrode-connected raised frame 138 of the BAW device P1A 102*a* and the first or lower-electrode-connected raised frame 136 of the BAW device P1B 102*b* can have substantially the same areas or lengths.

In FIGS. 2, 11, and 12, the BAW devices S2A 102e and S2B 102f are coupled bottom electrode 126 to top electrode 130, and can have substantially the same lengths or areas for their respective first and second raised frames 136 and 138. The lower-electrode-connected raised frame 136 of BAW device S2A can have substantially the same length and/or area as the upper-electrode-connected raised frame 138 of BAW device S2B. The upper-electrode-connected raised frame 138 of BAW device S2A can have substantially the same length and/or area as the lower-electrode-connected raised frame 136 of BAW device S2B. The BAW devices S2C 102g and S2D 102h can also have substantially the same lengths or areas for their respective first and second raised frames 136 and 138. The lower-electrode-connected raised frame 136 of BAW device S2C can have substantially the same length and/or area as the upper-electrode-connected raised frame 138 of BAW device S2D. The upper-electrode-connected raised frame 138 of BAW device S2C can have substantially the same length and/or area as the lower-electrode-connected raised frame 136 of BAW device S2D. The corresponding raised frame areas and/or lengths can be substantially the same, or can vary by the amounts discussed herein.

In some embodiments, the first or lower-electrode-connected raised frame structure 136 can have substantially the same area, width, and/or length as the second or upper-electrode-connected raised frame structure 138 on the BAW devices 102. In some embodiments, the first or lower-electrode-connected raised frame structure 136 can have an area, width, and/or length that differs from the area, width, and/or length of the second or upper-electrode-connected raised frame structure 138 on the BAW devices, such as by about 3%, about 5%, about 7%, about 10%, about 15%, about 20%, about 25%, about 30%, about 35%, about 40%, about 45%, about 50%, or more, or any values or ranges therebetween.

The upper electrode 130 can be electrically connected to the second conductive material 142 (e.g., a lead or conductive signal path) along an upper electrode connection 162, which can have a length. The lower electrode 126 can be electrically connected to the first conductive material 140 (e.g., a lead or conductive signal path) along a lower electrode connection 160, which can have a length. The lower electrode connection 160 can have a length that is substantially the same as the length of the corresponding lower-electrode-connected raised frame structure 136, and/or the upper electrode connection 162 can have a length that is substantially the same as the length of the corresponding upper-electrode-connected raised frame structure 138, as shown by the dashed lines in FIG. 9. The conductive material 140 and/or 142 can be formed along a path that approaches the BAW device 102 and also extends around a portion of the periphery of the BAW device 102 so that the corresponding lower electrode connection 160 and/or upper electrode connection 162 can have a length that is greater than the width along the path that approaches the BAW device 102. In some embodiments, the lower electrode connection 160 can have a length that is less than the length of the corresponding lower-electrode-connected raised frame structure 136, and/or the upper electrode connection 162 can have a length that is less than the length of the corresponding upper-electrode-connected raised frame structure 138, as shown by the dashed lines in FIG. 4. The conductive material 140 and/or 142 can be formed along a path that approaches the BAW device 102, and the lower electrode connection 160 and/or upper electrode connection 162 can have a length that corresponds to the width of the conductive path where it meets the corresponding electrode 126, 130.

The grouped BAW devices (e.g., forming resonator sub-elements of a resonator, such as for a filter) can different shapes, but substantially the same lengths for the corresponding electrode connections 160, 162. The respective lengths of the corresponding electrode connections 160, 162 can have a difference of not more than about 10%, about 8%, about 6%, about 5%, about 4%, about 3%, about 2%, about 1%, about 0.75%, about 0.5%, about 0.25%, about 0.2%, about 0.15%, about 0.1%, or less, or any values or ranges between any of these values. The upper electrode connection 162 of a first BAW device can have substantially the same length as the upper electrode connection 162 of the second BAW device (e.g., irregular speckle pattern or heavy-line-weight features matched with irregular speckle pattern or heavy-line-weight features), such as when the conductive material 142 couples the upper electrodes of the BAW devices. The lower electrode connection 160 of a first BAW device can have substantially the same length as the lower electrode connection 160 of the second BAW device (e.g., periodic speckle pattern or light-line-weight features matched with periodic speckle pattern or light-line-weight features), such as when the conductive material 140 coupled the lower electrodes of the BAW devices. However, in some cases, the upper electrode connection 162 of a first BAW device can have substantially the same length as the lower electrode connection 160 of the second BAW device (e.g., irregular speckle pattern or heavy-line-weight features matched with periodic speckle pattern or light-line-weight features), such as when the conductive materials 140 and 142 are coupled by an electrical coupling 112 (e.g., a via or other vertical coupling) so that the BAW devices are coupled upper electrode 130 to lower electrode 126.

When 4 BAW devices are grouped to form a resonator, such as in FIGS. 11-13, one or more of the parameters discussed herein can be matched between all 4 of the BAW devices. In other embodiments, a first pair of BAW devices (e.g., S2A and S2C) can have one or more of the first matched parameters, and a second pair of BAW devices (e.g., S2B and S2D) can have one or more second matched parameters, where the first matched parameters do not match the second matched parameters. The arrangement of 4 BAW devices can be a combination of two matched pairs. In some cases, matching all 4 BAW devices can provide improved reduction or cancelation of the nonlinear responses.

The resonator devices disclosed herein can be implemented in acoustic wave filters. In certain applications, the acoustic wave filters can be band pass filters arranged to pass a radio frequency band and attenuate frequencies outside of the radio frequency band. Two or more acoustic wave filters can be coupled together at a common node and arranged as a multiplexer, such as a duplexer.

Figure 14:
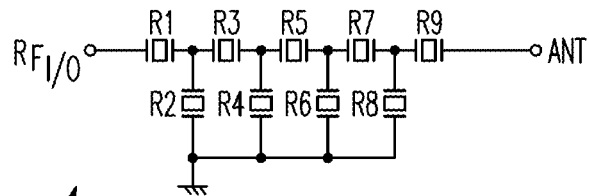
FIG. 14 is a schematic diagram of an example of an acoustic wave ladder filter.

FIG. 14 is a schematic diagram of an example of an acoustic wave ladder filter 220. The acoustic wave ladder filter 220 can be a transmit filter or a receive filter. The acoustic wave ladder filter 220 can be a band pass filter arranged to filter a radio frequency signal. The acoustic wave filter 220 can include series resonators R1, R3, R5, R7, and R9 and shunt resonators R2, R4, R6, and R8 coupled between a radio frequency input/output port RFI/O and an antenna port ANT. The radio frequency input/output port RFI/O can be a transmit port in a transmit filter or a receive port in a receive filter. One or more of the illustrated acoustic wave resonators can be a surface acoustic wave resonator in accordance with any suitable principles and advantages discussed herein. An acoustic wave ladder filter can include any suitable number of series resonators and any suitable number of shunt resonators.

An acoustic wave filter can be arranged in any other suitable filter topology, such as a lattice topology or a hybrid ladder and lattice topology. A surface acoustic wave resonator in accordance with any suitable principles and advantages disclosed herein can be implemented in a band pass filter. In some other applications, a surface acoustic wave resonator in accordance with any suitable principles and advantages disclosed herein can be implemented in a band stop filter.

Figure 15:
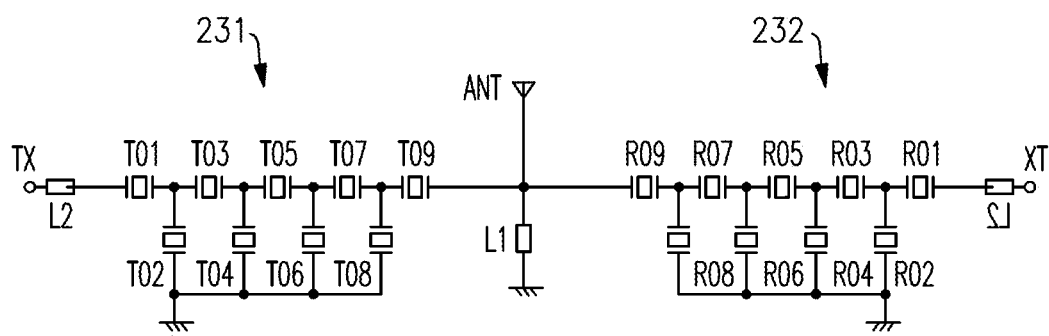
FIG. 15 is a schematic diagram of an example of a duplexer.

FIG. 15 is a schematic diagram of an example of a duplexer 230. The duplexer 230 can include a transmit filter 231 and a receive filter 232 coupled to each other at an antenna node ANT. A shunt inductor L1 can be connected to the antenna node ANT. The transmit filter 231 and the receive filter 232 can both be acoustic wave ladder filters in the duplexer 230.

The transmit filter 131 can filter a radio frequency signal and provide a filtered radio frequency signal to the antenna node ANT. A series inductor L2 can be coupled between a transmit input node TX and the acoustic wave resonators of the transmit filter 131. The illustrated transmit filter 131 can include acoustic wave resonators T01 to T09. One or more of these resonators can be surface acoustic wave resonator in accordance with any suitable principles and advantages disclosed herein. The illustrated receive filter can include acoustic wave resonators R01 to R09. One or more of these resonators can be a surface acoustic wave resonator in accordance with any suitable principles and advantages disclosed herein. The receive filter can filter a radio frequency signal received at the antenna node ANT. A series inductor L3 can be coupled between the resonator and a receive output node RX. The receive output node RX of the receive filter provides a radio frequency receive signal.

Figure 16:
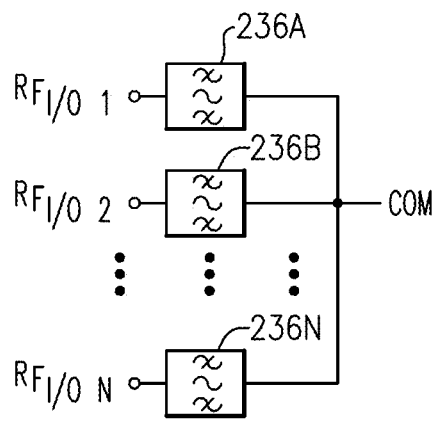
FIG. 16 is a schematic diagram of an example of a multiplexer.

FIG. 16 is a schematic diagram of a multiplexer 235 that includes an acoustic wave filter according to an embodiment. The multiplexer 235 can include a plurality of filters 236A to 236N coupled together at a common node COM. The plurality of filters can include any suitable number of filters including, for example, 3 filters, 4 filters, 5 filters, 6 filters, 7 filters, 8 filters, or more filters. Some or all of the plurality of acoustic wave filters can be acoustic wave filters. Each of the illustrated filters 236A, 236B, and 236N can be coupled between the common node COM and a respective input/output node RFI/O1, RFI/O2, and RFI/ON.

In some instances, all filters of the multiplexer 235 can be receive filters. According to some other instances, all filters of the multiplexer 235 can be transmit filters. In various applications, the multiplexer 235 can include one or more transmit filters and one or more receive filters. Accordingly, the multiplexer 235 can include any suitable number of transmit filters and any suitable number of receive filters. Each of the illustrated filters can be band pass filters having different respective pass bands.

The multiplexer 235 is illustrated with hard multiplexing with the filters 236A to 236N having fixed connections to the common node COM. In some other applications, one or more of the filters of a multiplexer can be electrically connected to the common node by a respective switch. Any of such filters can include a surface acoustic wave resonator according to any suitable principles and advantages disclosed herein.

A first filter 236A can be an acoustic wave filter having a first pass band and arranged to filter a radio frequency signal. The first filter 236A can include one or more surface acoustic wave resonators according to any suitable principles and advantages disclosed herein. A second filter 236B has a second pass band. In some embodiments, a raised frame structure of one or more surface acoustic wave resonators of the first filter 236A can move a raised frame mode of the one or more surface acoustic wave resonators away from the second passband. This can increase a reflection coefficient (Gamma) of the first filter 236A in the pass band of the second filter 236B. The raised frame structure of the surface acoustic wave resonator of the first filter 236A can also move the raised frame mode away from the passband of one or more other filters of the multiplexer 235.

In certain instances, the common node COM of the multiplexer 235 can be arranged to receive a carrier aggregation signal including at least a first carrier associated with the first passband of the first filter 236A and a second carrier associated with the second passband of the second filter 236B. A multi-layer raised frame structure of a surface acoustic wave resonator of the first filter 236A can maintain and/or increase a reflection coefficient of the first filter 236A in the second passband of the second filter 236B that is associated with the second carrier of the carrier aggregation signal.

The filters 236B to 236N of the multiplexer 235 can include one or more acoustic wave filters, one or more acoustic wave filters that include at least one surface acoustic wave resonator with a raised frame structure, one or more LC filters, one or more hybrid acoustic wave LC filters, or any suitable combination thereof.

The acoustic wave resonators disclosed herein can be implemented in a variety of packaged modules. Some example packaged modules will now be discussed in which any suitable principles and advantages of the surface acoustic wave devices disclosed herein can be implemented. The example packaged modules can include a package that encloses the illustrated circuit elements. The illustrated circuit elements can be disposed on a common packaging substrate. The packaging substrate can be a laminate substrate, for example. FIGS. 17, 18A, 18B, and 19 are schematic block diagrams of illustrative packaged modules according to certain embodiments. Certain example packaged modules can include one or more radio frequency amplifiers, such as one or more power amplifiers and/or one or more low noise amplifiers. Any suitable combination of features of these modules can be implemented with each other. While duplexers are illustrated in the example packaged modules of FIGS. 17, 18A, and 19, any other suitable multiplexer that includes a plurality of acoustic wave filters coupled to a common node can be implemented instead of one or more duplexers. For example, a quadplexer can be implemented in certain applications. Alternatively or additionally, one or more filters of a packaged module can be arranged as a transmit filter or a receive filter that is not included in a multiplexer.

Figure 17:
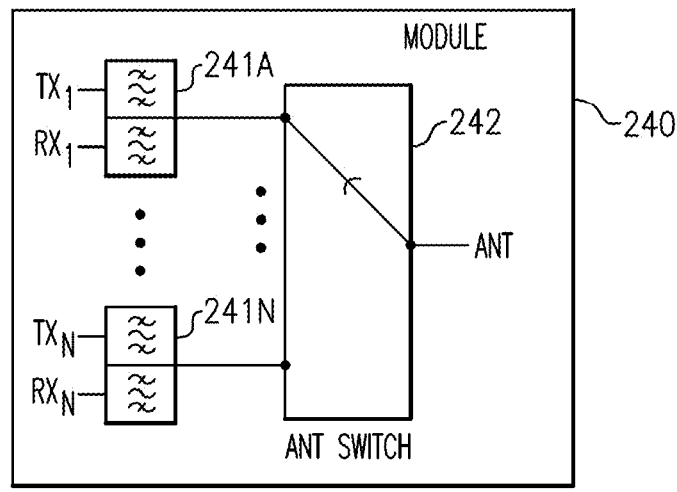
FIG. 17 is a schematic block diagram of a module that includes an antenna switch and duplexers that include one or more acoustic wave devices.

FIG. 17 is a schematic block diagram of an example module 240 that includes duplexers 241A to 241N and an antenna switch 242. One or more filters of the duplexers 241A to 241N can include any suitable number acoustic wave resonators in accordance with any suitable principles and advantages discussed herein. Any suitable number of duplexers 241A to 241N can be implemented. The antenna switch 242 can have a number of throws corresponding to the number of duplexers 241A to 241N. The antenna switch 242 can electrically couple a selected duplexer to an antenna port of the module 240.

Figure 18A:
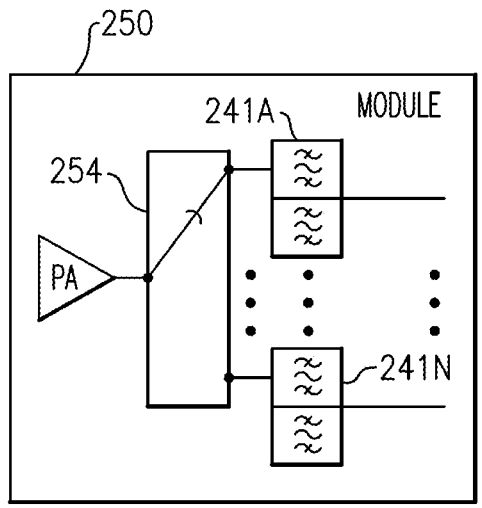
FIG. 18A is a schematic block diagram of a module that includes a power amplifier, a radio frequency switch, and duplexers that include one or more acoustic wave devices.

FIG. 18A is a schematic block diagram of an example module 250 that includes a power amplifier 252, a radio frequency switch 254, and duplexers 241A to 241N in accordance with one or more embodiments. The power amplifier 252 can amplify a radio frequency signal. The radio frequency switch 254 can be a multi-throw radio frequency switch. The radio frequency switch 254 can electrically couple an output of the power amplifier 252 to a selected transmit filter of the duplexers 241A to 241N. One or more filters of the duplexers 241A to 241N can include any suitable number of surface acoustic wave resonators in accordance with any suitable principles and advantages discussed herein. Any suitable number of duplexers 241A to 241N can be implemented.

Figure 18B:
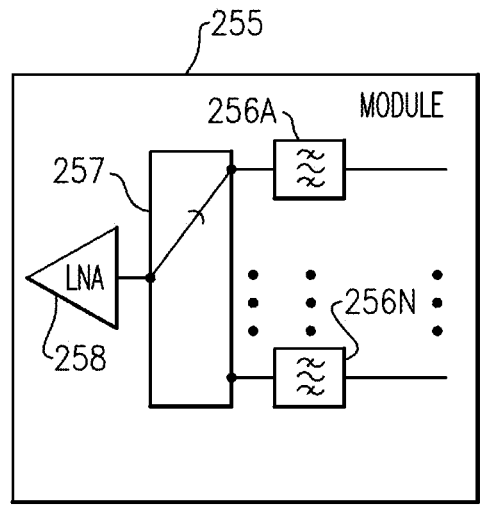
FIG. 18B is a schematic block diagram of a module that includes a low noise amplifier, a radio frequency switch, and acoustic wave filters that include one or more acoustic wave devices.

FIG. 18B is a schematic block diagram of an example module 255 that includes filters 256A to 256N, a radio frequency switch 257, and a low noise amplifier 258 according to one or more embodiments. One or more filters of the filters 256A to 256N can include any suitable number of surface acoustic wave resonators in accordance with any suitable principles and advantages disclosed herein. Any suitable number of filters 256A to 256N can be implemented. The illustrated filters 256A to 256N can be receive filters. In some embodiments (not illustrated), one or more of the filters 256A to 256N can be included in a multiplexer that also includes a transmit filter. The radio frequency switch 257 can be a multi-throw radio frequency switch. The radio frequency switch 257 can electrically couple an output of a selected filter of filters 256A to 256N to the low noise amplifier 257. In some embodiments (not illustrated), a plurality of low noise amplifiers can be implemented. The module 255 can include diversity receive features in certain applications.

Figure 19:
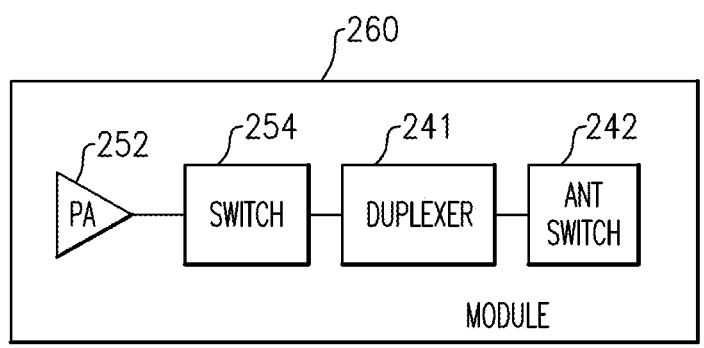
FIG. 19 is a schematic block diagram of a module that includes a power amplifier, a radio frequency switch, a duplexer that includes one or more acoustic wave devices.

FIG. 19 is a schematic block diagram of an example module 260 that includes a power amplifier 252, a radio frequency switch 254, and a duplexer 241 that includes surface acoustic wave device in accordance with one or more embodiments, and an antenna switch 242. The module 260 can include elements of the module 240 and elements of the module 250.

Figure 20A:
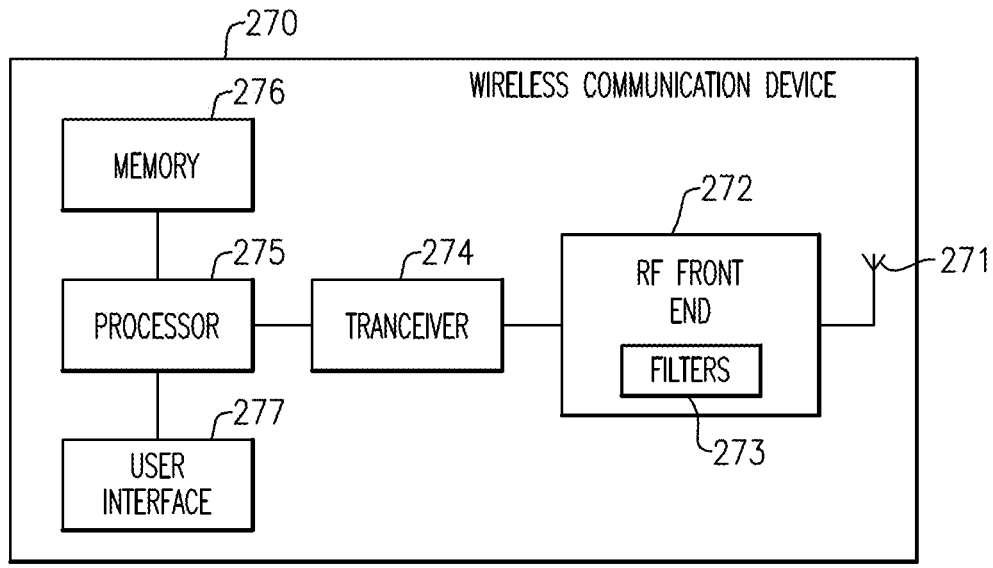
FIG. 20A is a schematic block diagram of a wireless communication device that includes filters that include one or more acoustic wave devices.

One or more filters with any suitable number of surface acoustic devices can be implemented in a variety of wireless communication devices. FIG. 20A is a schematic block diagram of an example wireless communication device 270 that includes a filter 273 with one or more acoustic wave resonators in accordance with any suitable principles and advantages disclosed herein. The wireless communication device 270 can be any suitable wireless communication device. For instance, a wireless communication device 270 can be a mobile phone, such as a smart phone. As illustrated, the wireless communication device 270 includes an antenna 271, a radio frequency (RF) front end 272 that includes filter 273, an RF transceiver 274, a processor 275, a memory 276, and a user interface 277. The antenna 271 can transmit RF signals provided by the RF front end 272. The antenna 271 can provide received RF signals to the RF front end 272 for processing.

The RF front end 272 can include one or more power amplifiers, one or more low noise amplifiers, RF switches, receive filters, transmit filters, duplex filters, filters of a multiplexer, filters of a diplexers or other frequency multiplexing circuit, or any suitable combination thereof. The RF front end 272 can transmit and receive RF signals associated with any suitable communication standards. Any of the acoustic wave resonators disclosed herein can be implemented in filters 273 of the RF front end 272.

The RF transceiver 274 can provide RF signals to the RF front end 272 for amplification and/or other processing. The RF transceiver 274 can also process an RF signal provided by a low noise amplifier of the RF front end 272. The RF transceiver 274 is in communication with the processor 275. The processor 275 can be a baseband processor. The processor 275 can provide any suitable base band processing functions for the wireless communication device 270. The memory 276 can be accessed by the processor 275. The memory 276 can store any suitable data for the wireless communication device 270. The processor 275 is also in communication with the user interface 277. The user interface 277 can be any suitable user interface, such as a display.

Figure 20B:
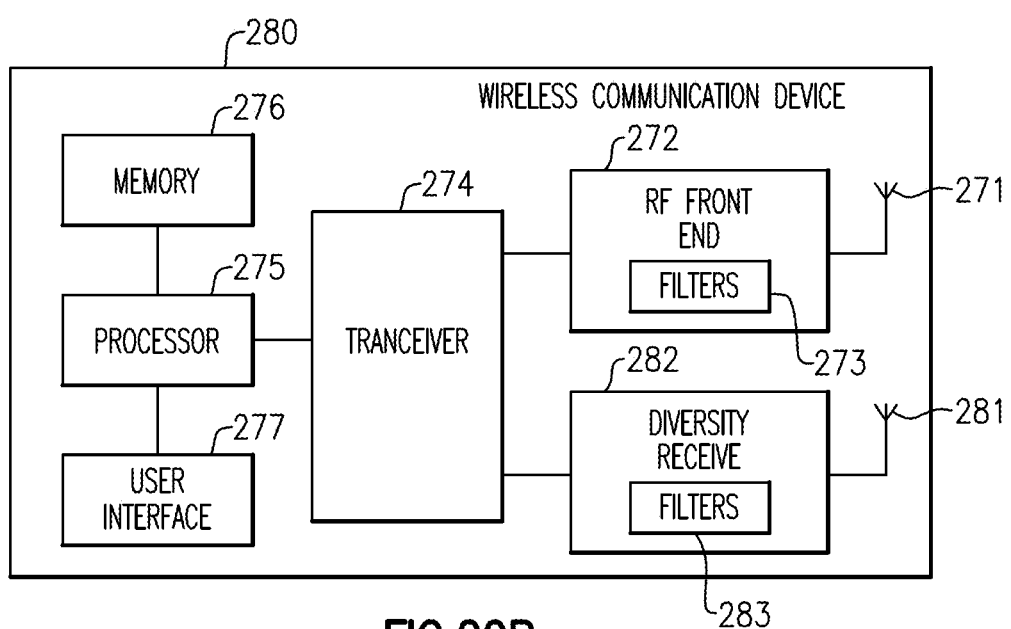
FIG. 20B is a schematic block diagram of another wireless communication device that includes filters that include one or more acoustic wave devices.

FIG. 20B is a schematic diagram of a wireless communication device 280 that includes filters 273 in a radio frequency front end 272 and second filters 283 in a diversity receive module 282. The wireless communication device 280 is like the wireless communication device 270 of FIG. 20A, except that the wireless communication device 280 also includes diversity receive features. As illustrated in FIG. 20B, the wireless communication device 280 can include a diversity antenna 281, a diversity module 282 configured to process signals received by the diversity antenna 281 and including filters 283, and a transceiver 274 in communication with both the radio frequency front end 272 and the diversity receive module 282. One or more of the second filters 283 can include a surface acoustic wave resonator in accordance with any suitable principles and advantages disclosed herein.

Acoustic wave devices disclosed herein can be included in a filter and/or a multiplexer arranged to filter a radio frequency signal in a fifth generation (5G) New Radio (NR) operating band within Frequency Range 1 (FR1). FR1 can from 410 megahertz (MHz) to 7.125 gigahertz (GHz), for example, as specified in a current 5G NR specification. A filter arranged to filter a radio frequency signal in a 5G NR FR1 operating band can include one or more acoustic wave resonators be implemented in accordance with any suitable principles and advantages disclosed herein.

5G NR carrier aggregation specifications can present technical challenges. For example, 5G carrier aggregations can have wider bandwidth and/or channel spacing than fourth generation (4G) Long Term Evolution (LTE) carrier aggregations. Carrier aggregation bandwidth in certain 5G FR1 applications can be in a range from 120 MHz to 400 MHz, such as in a range from 120 MHz to 200 MHz. Carrier spacing in certain 5G FR1 applications can be up to 100 MHz. Acoustic wave resonators as disclosed herein can have improved heat management, in some embodiments.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a frequency range from about 30 kHz to 300 GHz, such as in a frequency range from about 450 MHz to 8.5 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context indicates otherwise, throughout the description and the claims, the words "comprise," "comprising," "include," "including" and the like are to generally be construed in an inclusive sense, as opposed to an exclusive or exhaustive sense; that is to say, in the sense of "including, but not limited to." Conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

While certain embodiments have been described, these embodiments have been presented by way of example only, and are not intended to limit the scope of the disclosure. Indeed, the novel resonators, devices, modules, apparatus, methods, and systems described herein may be embodied in a variety of other forms. Furthermore, various omissions, substitutions and changes in the form of the resonators, devices, modules, apparatus, methods, and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and/or acts of the various embodiments described above can be combined to provide further embodiments. The accompanying claims and their equivalents are intended to cover such forms or modifications as would fall within the scope and spirit of the disclosure.

What is claimed is:

1. A filter comprising:
    a first acoustic wave device having a piezoelectric layer between a first electrode and a second electrode, the first acoustic wave device includes a first inner active area between a first raised frame and a second raised frame that are on first and second sides of the first acoustic wave device the first acoustic wave device having a first shape and a first area; and
    a second acoustic wave device coupled to the first acoustic wave device to at least partially cancel a second harmonic response of the first acoustic wave device, the second acoustic wave device having a piezoelectric layer between a first electrode and a second electrode, the second acoustic wave device includes a second inner active area between a third raised frame and a fourth raised frame that are on first and second sides of the second acoustic wave device, a first size of the first inner active area is within about 10% of a second size of the second inner active area, the second acoustic wave device having a second shape that is different from the first shape and a second area that is within about 10% of the first area.

2. The filter of claim 1 wherein the first acoustic wave device has a first perimeter length, and the second acoustic wave device has a second perimeter length that is within about 10% of the first perimeter length.

3. The filter of claim 1 wherein a perimeter portion length of the first raised frame on the first acoustic wave device is within about 10% of a perimeter portion length of the third raised frame on the second acoustic wave device, and a perimeter portion length of the second raised frame on the first acoustic wave device is within about 10% of a perimeter portion length of the fourth raised frame on the second acoustic wave device.

4. The filter of claim 1 wherein the first raised frame of the first acoustic wave device has a first raised frame area, the second raised frame of the first acoustic wave device has a second raised frame area, the third raised frame of the second acoustic wave device has a third raised frame area, the fourth raised frame of the second acoustic wave device has a fourth raised frame area, the first raised frame area of the first acoustic wave device is within about 10% of the third raised frame area of the second acoustic wave device, and the second raised frame area of the first acoustic wave device is within about 10% of the fourth raised frame area of the second acoustic wave device.

5. The filter of claim 1 wherein the first acoustic wave device has a first electrically conductive layer that is electrically coupled to the first electrode along a first electrical connection having a first electrode connection length, the first acoustic wave device has a second electrically conductive layer that is electrically coupled to the second electrode along a second electrical connection having a second electrode connection length, the second acoustic wave device has a first electrically conductive layer that is electrically coupled to the first electrode along a first electrical connection having a first electrode connection length, the second acoustic wave device has a second electrically conductive layer that is electrically coupled to the second electrode along a second electrical connection having a second electrode connection length, the first electrode connection length of the first acoustic wave device is within about 10% of the first electrode connection length of the second acoustic wave device, and the second electrode connection length of the first acoustic wave device is within about 10% of the second electrode connection length of the second acoustic wave device.

6. The filter of claim 1 wherein the first acoustic wave device is electrically coupled to the second acoustic wave device so that electrical current flows through the first acoustic wave device and the second acoustic wave device in opposite directions.

7. The filter of claim 1 wherein the first acoustic wave device and the second acoustic wave device have opposite voltage polarities across the piezoelectric layer.

8. The filter of claim 1 wherein the first acoustic wave device is coupled in series with the second acoustic wave device with either i) the first electrode of the first acoustic wave device electrically coupled to the first electrode of the second acoustic wave device, or ii) the second electrode of the first acoustic wave device electrically coupled to the second electrode of the second acoustic wave device.

9. The filter of claim 8 further comprising:
a third acoustic wave device having a piezoelectric layer between a first electrode and a second electrode, the third acoustic wave device having a third shape and a third area; and
a fourth acoustic wave device having a piezoelectric layer between a first electrode and a second electrode, the fourth acoustic wave device having a fourth shape that is different from the third shape and a fourth area that is within about 10% of the third area, the fourth acoustic wave device coupled in series with the third acoustic wave device, and the pair of the first and second acoustic wave devices coupled in parallel with the pair of the third and fourth acoustic wave devices.

10. The filter of claim 1 wherein the first acoustic wave device is coupled in parallel with the second acoustic wave device with the first electrode of the first acoustic wave device electrically coupled to the second electrode of the second acoustic wave device.

11. The filter of claim 10 further comprising:
a third acoustic wave device having a piezoelectric layer between a first electrode and a second electrode, the third acoustic wave device having a third shape and a third area; and
a fourth acoustic wave device having a piezoelectric layer between a first electrode and a second electrode, the fourth acoustic wave device having a fourth shape that is different from the third shape and a fourth area that is within about 10% of the third area, the fourth acoustic wave device coupled in parallel with the third acoustic wave device, and the pair of the first and second acoustic wave devices coupled in series with the pair of the third and fourth acoustic wave devices.

12. The filter of claim 1 wherein the first acoustic wave device is a bulk acoustic wave device, and the second acoustic wave device is a bulk acoustic wave device.

13. A system comprising:
a first bulk acoustic wave resonator that includes a substrate, a first electrode, a piezoelectric layer, and a second electrode, the piezoelectric layer between the first electrode and the second electrode, the first electrode between the piezoelectric layer and the substrate, the first bulk acoustic wave resonator having a first shape, a first inner active area disposed inward of a first raised frame and a second raised frame that are on second sides of the first bulk acoustic wave resonator, and a first perimeter length; and
a second bulk acoustic wave resonator that includes a substrate, a first electrode; a piezoelectric layer, and a second electrode, the piezoelectric layer between the first electrode and the second electrode, the first electrode between the piezoelectric layer and the substrate, the second bulk acoustic wave resonator having a second shape that is different from the first shape, a second inner active area disposed inward of a third raised frame and a fourth raised frame that are on first and second sides of the second bulk acoustic wave resonator, a first size of the first inner active area varies by not more than about 10% from a second size of the second inner active area, and the second bulk acoustic wave resonator having a second perimeter length that is varies by not more than about 10% from the first perimeter length.

14. The system of claim 13 wherein the first bulk the first raised frame has a first length, the second raised frame has a second length, the third raised frame has a third length and the fourth raised frame has a fourth length, the first length of the first raised frame on the first bulk acoustic wave resonator is within about 10% of the third length of the third raised frame on the second bulk acoustic wave resonator, and the second length of the second raised frame on the first bulk acoustic wave resonator is within about 10% of fourth length of the fourth raised frame on the second bulk acoustic wave resonator.

15. The system of claim 13 wherein the first bulk acoustic wave resonator has a first nonlinear response, the second bulk acoustic wave resonator has a second nonlinear response, and the first and second bulk acoustic wave resonators are coupled to at least partially cancel a first and second nonlinear responses.

16. The system of claim 13 wherein the first electrode of the first bulk acoustic wave resonator is electrically coupled to the first electrode of the second bulk acoustic wave resonator or the second electrode of the first bulk acoustic wave resonator is electrically coupled to the second electrode of the second bulk acoustic wave resonator, to electrically couple the first and second bulk acoustic wave resonators in series.

17. The system of claim 13 wherein the first electrode of the first bulk acoustic wave resonator is coupled to the second electrode of the second bulk acoustic wave resonator, and the second electrode of the first bulk acoustic wave resonator is coupled to the first electrode of the second bulk acoustic wave resonator, to electrically couple the first and second bulk acoustic wave resonators in parallel.

18. An acoustic wave filter comprising:
a first bulk acoustic wave resonator that includes a piezoelectric layer between a lower electrode and an upper electrode, the first bulk acoustic wave resonator having a first shape, a first perimeter length, and a first inner active area between a first raised frame and a second raised frame that are on first and second sides of the first bulk acoustic wave resonator; and
a second bulk acoustic wave resonator having a piezoelectric layer between a lower electrode and an upper electrode, the second bulk acoustic wave resonator having a second shape that is different from the first shape and a second perimeter length that varies by not more than about 10% from the first perimeter length, the second bulk acoustic wave resonator includes a second inner active area between a third raised frame and a fourth raised frame that are on first and second sides of the second bulk acoustic wave resonator, a first size of the first inner active area is within about 10% of a second size of the second inner active area.

19. The acoustic wave filter of claim 18 wherein the second bulk acoustic wave resonator is configured to at least partially cancel a second harmonic response of the first bulk acoustic wave resonator.

20. The acoustic wave filter of claim 18 wherein the first bulk acoustic wave resonator is electrically coupled to the second bulk acoustic wave resonator so that electrical current flows through the first bulk acoustic wave resonator from the upper electrode to the lower electrode, and so that electrical current flows through the second bulk acoustic wave resonator from the lower electrode to the upper electrode.

21. The acoustic wave filter of claim 18 wherein an active region of the first bulk acoustic wave resonator where the lower electrode, the piezoelectric layer, and the upper electrode overlap has a first area, and an active region of the second bulk acoustic wave resonator where the lower electrode, the piezoelectric layer, and the upper electrode overlap has a second area that varies by not more than about 10% from the first area.

* * * * *